US011416761B2

(12) United States Patent
Delfosse et al.

(10) Patent No.: US 11,416,761 B2
(45) Date of Patent: Aug. 16, 2022

(54) FAULT-TOLERANT QUANTUM CAT STATE PREPARATION

(71) Applicant: Microsoft Technology Licensing, LLC, Redmond, WA (US)

(72) Inventors: Nicolas Guillaume Delfosse, Belleview, WA (US); Krysta Marie Svore, Seattle, WA (US); Benjamin Walter Reichardt, Santa Monica, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 292 days.

(21) Appl. No.: 16/856,274

(22) Filed: Apr. 23, 2020

(65) Prior Publication Data

US 2021/0334688 A1 Oct. 28, 2021

(51) Int. Cl.
*G06N 10/00* (2022.01)
*B82Y 10/00* (2011.01)
*H03K 19/195* (2006.01)

(52) U.S. Cl.
CPC .............. *G06N 10/00* (2019.01); *B82Y 10/00* (2013.01); *H03K 19/195* (2013.01)

(58) Field of Classification Search
CPC ....... G06N 10/00; B82Y 10/00; H03K 19/195
USPC .......................................................... 706/62
See application file for complete search history.

(56) References Cited

U.S. PATENT DOCUMENTS 10,931,146 B2 * 2/2021 Fan ...................... H02J 50/90
11,126,062 B1 * 9/2021 Kieling ................ G02F 1/3501
2007/0174227 A1 * 7/2007 Johnson ................ G06N 10/00
706/62

OTHER PUBLICATIONS

Aliferis, et al., "Quantum Accuracy Threshold for Concatenated Distance-3 Codes", In Repository of arXiv:quant-ph/0504218v3, Oct. 21, 2005, pp. 1-58.
"International Search Report and Written Opinion Issued in PCT Application No. PCT/US2021/021452", dated Jun. 18, 2021, 30 Pages.
Preskill, John, "Fault-Tolerant Quantum Computation", In Repository of arXiv:quant-ph/9712048v1, Dec. 19, 1997, pp. 1-58.
Weinstein, et al., "On the Use of Shor States for The [7,1,3] Quantum Error-Correcting Code", In Journal of Physical Review A (Atomic, Molecular, and Optical Physics and Quantum Information), vol. 86, No. 5, Nov. 30, 2012, 7 Pages.

* cited by examiner

*Primary Examiner* — Don P Le
(74) *Attorney, Agent, or Firm* — Holzer Patel Drennan

(57) ABSTRACT

A quantum computing system is adapted to prepare a cat state in a quantum circuit with fault tolerance t and circuit depth less than or equal to 4+4t by performing a series of operations that includes: performing a sequence of joint parity measurements on individual pairs of neighboring qubits in a series of qubits entangled to form an initial cat state; repeating the sequence of measurements over at least t-rounds; and disentangling a first set of alternating qubits from the initial cat state, the prepared cat state being formed by a remaining second set of alternating qubits, the second set of alternating qubits being interlaced with the first set of alternating qubits along a line of one-dimensional connectivity, the series of operations being sufficient to guarantee that a prepared cat state is has less than or equal to t number of faults.

20 Claims, 15 Drawing Sheets

(a) (b) (c)

FAULT-TOLERANT QUANTUM CAT STATE PREPARATION

BACKGROUND

Shor cat states or simply "cat states" are formed by highly entangling the quantum states of multiple qubits. Cat states are used in several types of quantum operations to provide fault-tolerant computations, including implementation of logical operations (e.g., operations both internal to logical blocks and across different logical blocks), quantum error correction, and teleportation of a quantum state from one bit to another. For example, cat states may be used to perform a Pauli operator measurement of two or more data qubits. Such a measurement entails (1) entangling a group of ancilla qubits through a series of operations to create a cat state of those ancilla qubits; (2) entangling the data qubits that are to be measured with those qubits of the prepared cat state; and (3) performing single qubit measurements of each of the ancilla qubits to extract the data qubit measurement, which is given by the collective parity of the bits subject to this measurement.

SUMMARY

According to one implementation, a quantum circuit with fault tolerance t and circuit depth less than or equal to 4+4t performs a cat state by performing a series of operations that includes: performing a sequence of joint parity measurements on individual pairs of neighboring qubits in a series of qubits entangled to form an initial cat state; repeating the sequence of measurements over at least t-rounds; and disentangling a first set of alternating qubits from the initial cat state to form the prepared cat state with a remaining second set of alternating qubits that is interlaced with the first set of alternating qubits along a line of one-dimensional connectivity. The prepared cat state is guaranteed with a predefined degree of certainty to include less than or equal to t number of faults. Other implementations are also described and recited herein.

DETAILED DESCRIPTION

Figure 1:
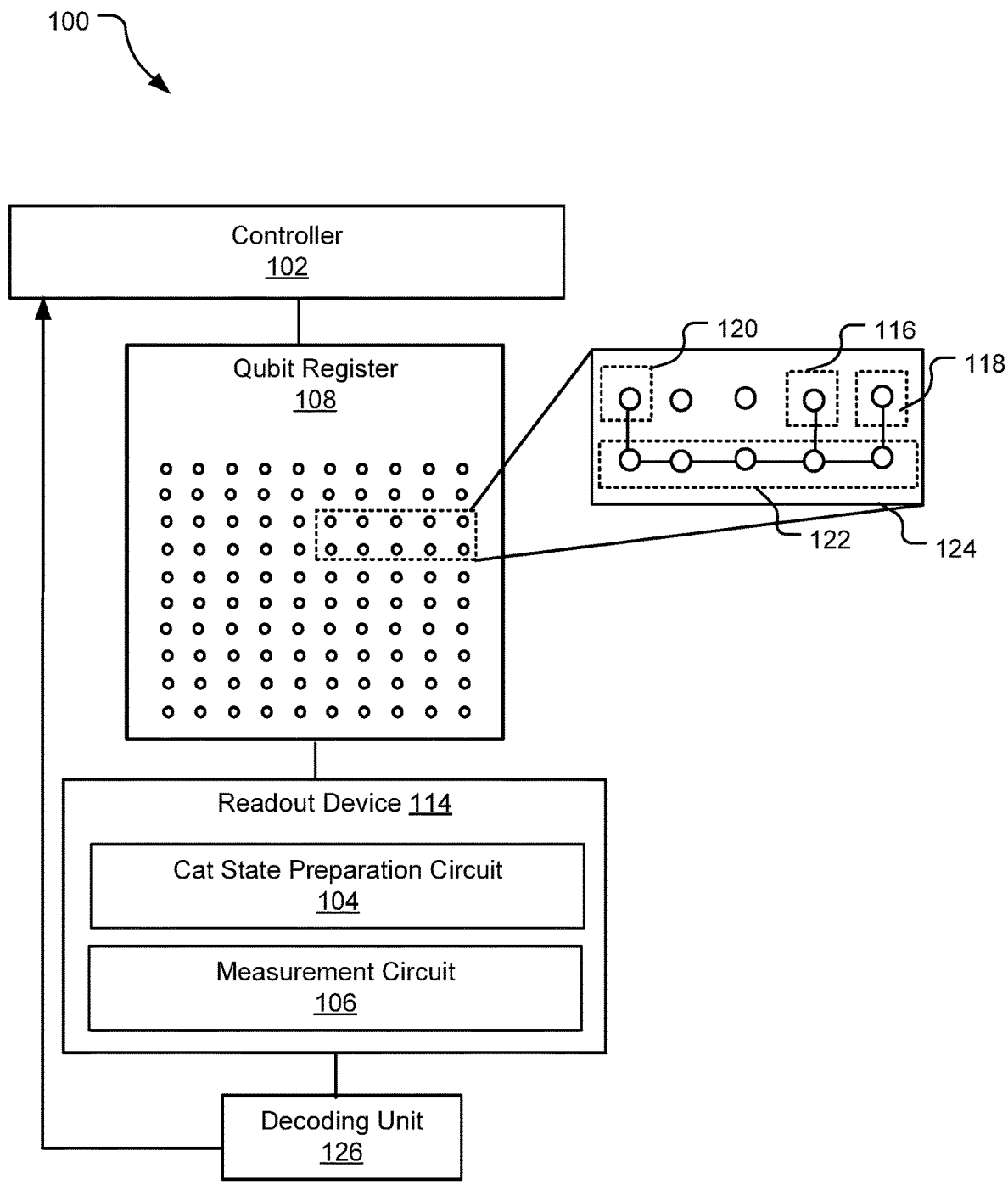
FIG. 1 illustrates a quantum computing system that includes a short-depth fault-tolerant cat state preparation circuit.

Preparation of a Shor cat state entails performing a sequence of measurements to entangle a select group of qubits. This process may be followed by a post-selection phase in which a series of measurements are performed to verify that that the cat state has been prepared with some degree of sufficiency (e.g., that the cat state contains a number of faults that is equal to or less than a pre-defined fault-tolerance of the corresponding measurement circuit).

Existing Shor cat state post-selection (testing) methods measure the parity of random pairs of qubits inside the cat state. Ensuring the cat state is prepared accurately enough entails a large number of measurements and a high degree of qubit connectivity (e.g., a connection between every and each ancilla used in the post-selection test and all qubits in the cat state). This high degree of connectivity is difficult to obtain in currently-proposed quantum platforms including, for example within a grid of qubits, using superconducting qubits, using Majorana qubits, or when using logical qubits encoded with surface codes, color codes, or small code blocks. Moreover, this method of testing random pairs of qubits in the cat state entails a significant number of rounds of measurement, each of which consumes significant processing time. For example, each round of measurement may take about 100 ns for superconducting qubits or 100 microseconds for ion traps.

The herein disclosed technology provides circuitry for cat state preparation and testing methods for testing a prepared cat state that can be implemented with lower processing time overhead (e.g., fewer rounds of measurement) and reduced hardware requirements (e.g., a less degree of connectivity between qubits) as compared to the above-described existing testing methods. According to one implementation, a fault-tolerant cat state is formed with a single line of qubits exhibiting 1D connectivity. This line of qubits can be carved out of a general graph to connect an arbitrary pair of qubits. For instance, the line of qubits may be any qubit path in a square grid. Alternatively the line of qubits may extend through multiple levels of a tree or throughout any line of connectivity of a general graph. The cat state is produced and tested using post-selection methods in conjunction with a short depth circuit that is, in one implementation, of maximum depth 4+2t, where t is a defined as fault tolerance of the circuit. In another implementation referred to herein as a "rejection-free circuit," error correction is performed instead of a technique known as post-selection (described with respect to FIG. 3). In this implementation, the cat state may be prepared using a circuit of maximum depth 4+4t.

As used herein "circuit depth" refers to the number of time-separated measurements or rounds of measurements performed. For example, a depth-3 circuit performs three rounds of measurement, each of which may entail multiple simultaneous individual qubit measurements. In general, the herein disclosed circuits (e.g., of depth 4+2t or 4+4t) are significantly shorter in depth than the typical circuit depths required to implement the above-described existing cat state preparation methodology that entails measuring random pairs of qubits within the cat state. In these existing cat state preparation methods, the number rounds of measurement rounds (and thus, computation time) grows with the size of the cat state because each qubit of the cat state is moved one at a time from a location where the cat state is prepared to a location where the cat state is used to perform a data qubit measurement. In the implementations disclosed below with respect to FIG. 1-6, the circuit depth of the various exemplary cat state preparation circuits is independent of qubit connectivity, cat state size, and distance between the qubits in the series used to create the cat state.

FIG. 1 illustrates a quantum computing system 100 that includes a cat state preparation circuit 104 to prepare cat states used by a measurement circuit 106 to measure groups of two or more qubits in a qubit register 108. According to one implementation, the cat state preparation circuit 104 is a short-depth circuit of length 4+2t, where t is the fault tolerance of a measurement circuit 106.

Each cat state prepared by the cat state preparation circuit 104 is "fault-tolerant," meaning that the prepared cat state contains a fewer number of faults than t, the predefined fault tolerance of the measurement circuit 106. The cat state preparation circuit 104 is designed to generate a fault-tolerant cat state by executing a series of operations, described in detail below, to entangle select groups of qubits in the qubit register 108. The measurement circuit 106 extracts measurements of data qubits residing within the quantum register 108 using the prepared cat states as ancilla qubits, meaning that the ancilla qubits are measured and their quantum state destroyed while preserving the quantum states of the data qubits.

The quantum computing system 100 includes a controller 102 that performs calculations by manipulating qubits within the quantum register 108. Values of the qubits resulting from such manipulations are read by a read-out device 114, which includes the cat state preparation circuit 104 and the measurement circuit 106. Each of these circuits may be each understood as including hardware, such as one or more quantum and/or classical processors, and/or classically-implemented software. Hardware components of the cat state preparation circuit 104 and the measurement circuit 106 are designed to execute sequences of quantum operations on the physical qubits in the qubit register 108 while software components of the two circuits are designed to classically manipulate measured qubit values.

In order to measure any combination of two or more data qubits in the qubit register, the controller 102 instructs the cat state preparation circuit 104 to prepare a cat state that entangles together a line of qubits providing physical connectivity between specific data qubits that are the target of the measurement. For example, to measure exemplary target qubits 116, 118, and 120 (shown in View 124), a cat state may be formed to entangle the five connecting qubits in an adjacent row 122. These entangled qubits act as ancillas that are used as a tool for extracting the quantum state of the target data qubits. To prepare the cat state, the cat state preparation circuit 104 performs a series of operations to entangle each neighboring 1 pair of the cat state qubits. A detailed example of initial cat state preparation is discussed below with respect to FIG. 2A-2B.

After preparing the initial cat state by entangling the ancilla qubits (e.g., the five qubits in row 122), the cat state preparation circuit 104 performs testing to ensure the cat state is fault tolerant to within a predefined sufficiency metric. This cat state testing phase entails performing a sequence of joint parity measurements on individual pairs of the ancilla qubits supporting the cat state. As used herein, the term "joint parity measurement is used broadly to refer to either a native joint parity measurement or a measurement commonly understood in the industry as being a joint parity equivalent. For example, a "joint parity equivalent" may be a 2-qubit measurement performed by applying a 2-qubit gate (such as CNOT or CZ) followed by a single qubit measurement. Example test techniques are discussed below with respect to FIGS. 3-6. After testing ensures that the prepared cat state includes a number of faults less than or equal to the fault tolerance of the measurement circuit 106, the measurement circuit 106 connects (entangles) the target qubits 116, 118, 120 with the prepared cat state and extracts a measurement of the target qubits 116, 118, and 120 from the qubits of the prepared cat state.

In the illustrated example, the measurement result is extracted by performing a single qubit measurement of each of the five entangled cat state qubits in the row 122 (e.g. retrieving one bit of information from each different one of the cat state qubits). The extracted measurement represents the parity of the cat state qubits. For example, the extracted measurement may be 0 0 1 0 1, with the parity being '1' to indicate that the total the number of ones is even.

Measurements extracted by the measurement circuit 106 may be provided to a decoding unit 126 that implements a quantum error correction code (QECC) to identify the locations of faults that affected the measurement outcome. In general, a QECC may be able to correct up to a predefined detectable number of faults. This number is generally referred to as the fault tolerance of the QECC. A QECC that is t-fault-tolerant can correct up to 't' number of faults in a syndrome measurement provided that the syndrome measurement is performed using a t-fault-tolerant cat state, where t=(d−1)/2 and d is the minimum distance of the QECC. Using the fault locations identified by the QECC, the parity of the cat state measurement, and the known set of quantum operations performed to implement measurements and derive the processed measurement outcome, the controller 102 is able to determine the quantum state of the individual target qubits 116, 118, and 120.

Notably, the reliability of the above-described data qubit measurement depends on quality of the cat state. To ensure reliability, the cat state must satisfy a sufficiency metric that, in one implementation, ensures that the number of faults present in the prepared cat state is less than or equal to a defined fault-tolerance level.

When traditional methods are employed, cat state preparation depends on a high degree of connectivity between qubits. For instance, the cat state may be tested via a testing a methodology that requires connectivity between each ancilla used to test the cat state and each individual qubit within the cat state. In these designs, cat state preparation and verification is achieved at a tradeoff between qubit connectivity and processing overhead. When connectivity is limited, processing overhead is much higher. Likewise, processing overhead may be reduced by a more complex and expensive architecture that provides greater connectivity between qubits.

In contrast these traditional approaches, the cat state preparation circuit 104 implements a methodology that significantly reduces the hardware requirement (e.g., both connectivity and processing time) that is requisite for both preparing and verifying a fault-tolerant cat state.

According to one implementation, the cat state preparation circuit 104 is a short depth circuit of length less than or equal to 4+2m, where m is the fault tolerance level of the measurement circuit 106. If, for example, the measurement circuit 106 has a fault tolerance of t=2, this means that the measurement circuit is capable of executing quantum error correction code (QECC) to correct up 2 faults present in any given measurement. In the example where the fault tolerance level is 2, the cat state preparation circuit 104 has a depth of 8 (4+2(2)), which means that a fault-tolerant cat circuit can be implemented with no more than 8 total rounds of measurement. In contrast, above-mentioned traditional cat state preparation techniques require much greater qubit connectivity and/or a much greater depth (e.g., a depth that is at least proportion with the cat state size) to guarantee the cat state satisfies the fault tolerance of the measurement circuit 106.

Figure 2A:
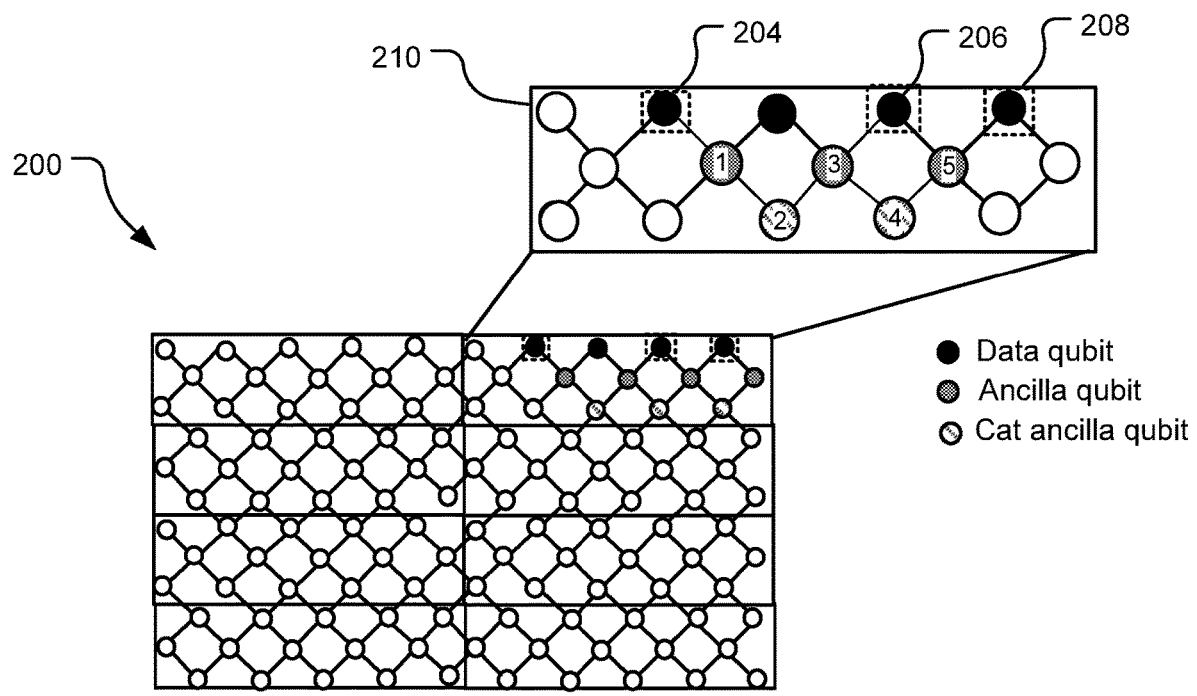
FIG. 2A illustrates a qubit grid in a quantum computing device.

FIG. 2A illustrates a qubit grid 200 in a quantum computing device. According to one implementation, a data measurement operation of select qubits (the "target data qubits" 204, 206, and 208) is performed by preparing a cat state, connecting the prepared cat state to the target data qubits 204, 206, and 208, and extracting the measurement. The cat state entangles a series of k qubits, and each of the target data qubits 204, 206, 208 is physically connected to at least one of the k qubits in the final cat state. For example, qubits 1, 2, 3, (shown in exploded view 210) may be entangled to form a cat state that is the used to measure the target data qubits 204, 206, 208.

Figure 2B:
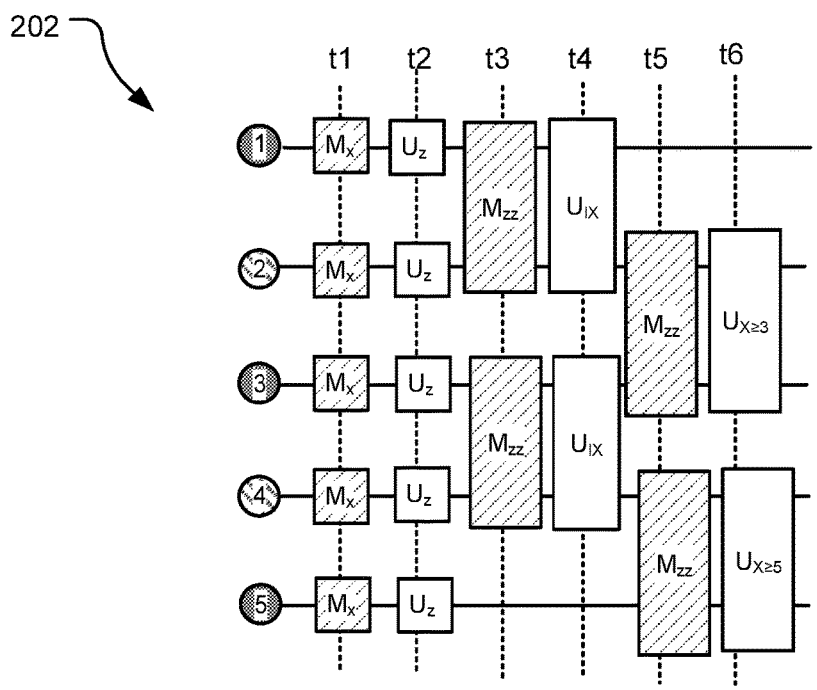
FIG. 2B illustrates an example fault-tolerant cat state preparation circuit that prepares a cat state usable to measure the target data qubits of FIG. 2A.

FIG. 2B illustrates an example fault-tolerant cat preparation circuit 202 that prepares a cat state usable to measure the target data qubits 204, 206, 208 of FIG. 2A. The final cat state used in this target data qubit measurement is referred to herein as the "prepared cat state." In this example, the prepared cat state includes k qubits (e.g., qubits 1, 3, 5) and is formed via a sequence of operations that includes: (1) initially entangling N qubits; (2) performing testing to verify reliability of the cat state; and (3) ultimately discarding some of the N qubits such the remaining prepared cat state is reduced from N to k qubits.

The N qubits are physically arranged in a line with 1D connectivity such that the cat preparation circuit 202 is equipped to perform joint measurements $M_{z_i z_{i+1}}$ for i=1,2, . . . , N−1. In the illustrated example (shown in exploded view 210 of FIG. 2A), this sequence of N qubits includes the series of qubits labeled 1, 2, 3, 4, 5 arranged along a line that zig-zags to consecutively intersect the qubits in numerical order. By example and without limitation, the total number of qubits in the series N is assumed to be odd such that N is equal to a 2n+1, where n is the odd-numbered qubits in the sequence N. The n odd qubits 1, 3, . . . N are regarded as the ancilla qubits that are to form the prepared cat state usable in the measurement of the target data qubits 204, 206, 208.

In contrast, the even-numbered qubits (e.g., 2, 4, . . . N−1) serve a different role and are referred to herein as cat ancilla qubits. The cat ancilla qubits are connected to one another through the ancilla qubits, and the function of the cat ancilla qubits is to support measurements performed to test the reliability of the prepared cat state.

Given the foregoing assumptions, the objective of the cat preparation circuit 202 is ultimately to prepare a k-qubit cat state of the form:

$$\frac{1}{\sqrt{2}}(|0 \ldots 0\rangle + |1 \ldots 1\rangle) \quad (1)$$

Supported on an arbitrary subset of k data qubits I={$i_1$ . . . $i_k$} with $i_1 < i_2 < \ldots i_k$. In the example of FIG. 2, qubits 2, 4, 6, 8, and 10 are cat ancilla qubits that do not support the final cat state. Instead, the cat state is supported by the set of qubits I={1, 3, . . . 2k−1}.

To generate the prepared cat state, the cat state preparation circuit 202 performs a sequence of operations that includes a combination of alternating measurements (e.g., $M_X$) and classically-implemented update operations (e.g., $M_z$). In FIG. 2B, each of the horizontal lines may be understood as representing a time-axis defining a sequence of quantum measurement operations (denoted by shaded boxes (e.g., $M_x$, $M_{zz}$)) and classically-implemented measurement update operations (denoted by unshaded boxes (e.g., $U_z$, $U_{IX}$)).

The output of the measurement circuit 202 can, for each individual qubit, be expressed as a classical quantum state $s^f$, which is equal to the sum of the quantum measurement outcome (s) observed for that qubit at the circuit output combined with an correction term that represents a correction for accumulated errors tracked in conjunction with the individual measurements performed on the qubit within the circuit. Using this principle of classical quantum states, there exists a set of propagation rules that allow for (1) defining a measurement update operations (e.g., an N-qubit arbitrary Pauli operation) in association with each individual measurement of a sequence of measurements on a qubit, where each measurement update operation forces a measured outcome to a set value (e.g., a trivial outcome free of error); and (2) propagating this set of measurement operations to the end of the cat state preparation circuit 202 such that (3) the quantum state of each qubit (1-5) may, at any given time, be defined by the measurement of that qubit classically-updated by the propagated set of measurement update operations. The classically-updated outcome of a measurement is referred to herein as the "processed outcome," which is a measurement of a classical-quantum state.

Explained in more mathematical terms, a Pauli frame for the set of N qubits may be defined to be a pair of vectors $f=(f_x, f_z) \in Z_2^N \times Z_2^N$ used to keep track of the accumulation of Pauli operations (P) performed on the qubits. The state of a quantum device may be defined at any given time state as a classical-quantum state $(|\psi\rangle, f)$ where $|\psi\rangle$ is the state of the N-qubit system and f is the current Pauli frame. Manipulating the classical data f allows for a simple implementation of Pauli gates. Measurement of a Pauli observable Q projects the quantum state onto the image of the projector $(I+(-1)^2 Q)/2$ (where I is the identity matrix) and returns the processed outcome:

$$s^f = s + [f, \pi_{S_p}(Q)] \quad (2)$$

where s is the actual measured outcome, f is the corresponding Pauli frame, and $\pi_{S_p}(Q)=(u_z, u_x) \in Z_2^N \times Z_2^N$, which is the symplectic representation of Q having square brackets [. , .] that denote the symplectic inner product. Thus, the measurement post-processing needs only the data of the local frames $f_i = (f_{Z,i}, f_{X,i}) \in Z_2^2$ of the measured qubits. The two classical-quantum states $(P|\psi\rangle)$ and $(|\psi\rangle, f+\pi_{S_p(P)})$ lead to the same outcome distribution for any sequence of measurements (M1, M2). In other words, any Pauli operation P can be implemented as a frame update:

$$f \leftarrow f + \pi_{S_p}(P) \quad (3)$$

This provides a classical implementations for any single or two-bit Pauli measurement. The frame is initialized with zero vectors and is updated during a measurement update according to Eq. (3). In sum, a classically-implemented frame update operation (e.g., $U_z$) is implemented by a classical control device capable of:

(1) Storing the 2N bits of the Pauli frame f;
(2) Computing bitwise XOR for the frame update$\leftarrow f + \pi_{S_p}$(P); and
(3) Computing binary inner products for the outcome processing$\leftarrow f + \pi_{S_p}(P)$ Using the foregoing principles, the measurement steps of FIG. 2B, denoted by shaded boxes (e.g., $M_x$, $M_{zz}$) may each be understood as representing the "processed outcome" which is, as defined above, the outcome of the qubit measurement updated classically by taking into account the frame of the qubits.

At a first point in time t1, the cat state preparation circuit 202 performs a single qubit measurement in the x-basis ($M_x$) on each individual one of the qubits in the series N (1-5). Following the single-qubit x-basis measurements, the cat state preparation circuit 202 performs (at time t2) a classically-implemented frame update in the z-basis ($U_z$) on each of the N qubits. The classically-implemented update applies an N-qubit arbitrary Pauli operation in the z-basis that forces the classical-quantum state of each the N qubits to the positive state ($|+\rangle$). Thus, the set of measurements $M_x$ (performed at t1) and the classically-implemented frame update operations $U_z$ (performed at t2) collectively operate to prepare the associated qubits (1-5) in the positive state (e.g., by defining and classically applying a measurement update that forces the classical-quantum state to the $|+\rangle$) state.

At time t3, (after each of the qubits 1, 2, 3, 4, 5 has been prepared in the positive state), z-basis joint parity measurements ($M_{zz}$) are performed to entangle pairs of neighboring qubits 1, 2 and 3, 4, respectively. This is followed, at t4, by another set of classically-implemented frame update operations $U_{IX}$, where $U_{IX}$ is an arbitrary 2-qubit Pauli update operation applying "I" (the identity matrix) to the first qubit and an X-basis update to force the measurement of the second qubit to a known value. This produces a state of $|00\rangle + |11\rangle$ over the two qubits.

At time t5, another set of z-basis joint parity measurements are performed to entangle pairs of qubits 2, 3, and 4,5 respectively. This is followed, at time t6, by another set of classically-implemented measurement update operations $U_{X\geq3}$ and $U_{X\geq5}$. Here, $U_{X\geq3}$ is an arbitrary N-qubit Pauli operation that acts in the X-basis of qubits 3, 4, 5 to force the quantum-classical state over all five qubits is forced to a known value ($|11111\rangle + |11111\rangle$). Likewise, $U_{X\geq5}$ is an arbitrary N-qubit Pauli operation that acts on the x-basis of qubit 5 to force the quantum-classical state over all five qubits to again equal the known value ($|11111\rangle + |11111\rangle$).

The above-described sequence of operations serves to prepare an initial cat state of the qubits in N (1-5). Although not shown with respect to FIG. 2B, the cat state circuit next undergoes a testing or post-selection phase to guarantee that the cat state satisfies a sufficiency metric. Following testing/post-selection, the cat ancilla qubits are discarded (e.g., measured independently to disentangle them from the cat state), leaving behind the prepared cat state, which includes only the qubits 1, 2, and 3. This cat stat is then used in the final data qubit measurement.

Testing of the cat state preparation circuit 202 and derivation of the final cat state is, in one implementation, performed via a set of operations the same or similar to those detailed with respect to FIG. 3, below.

Figure 3:
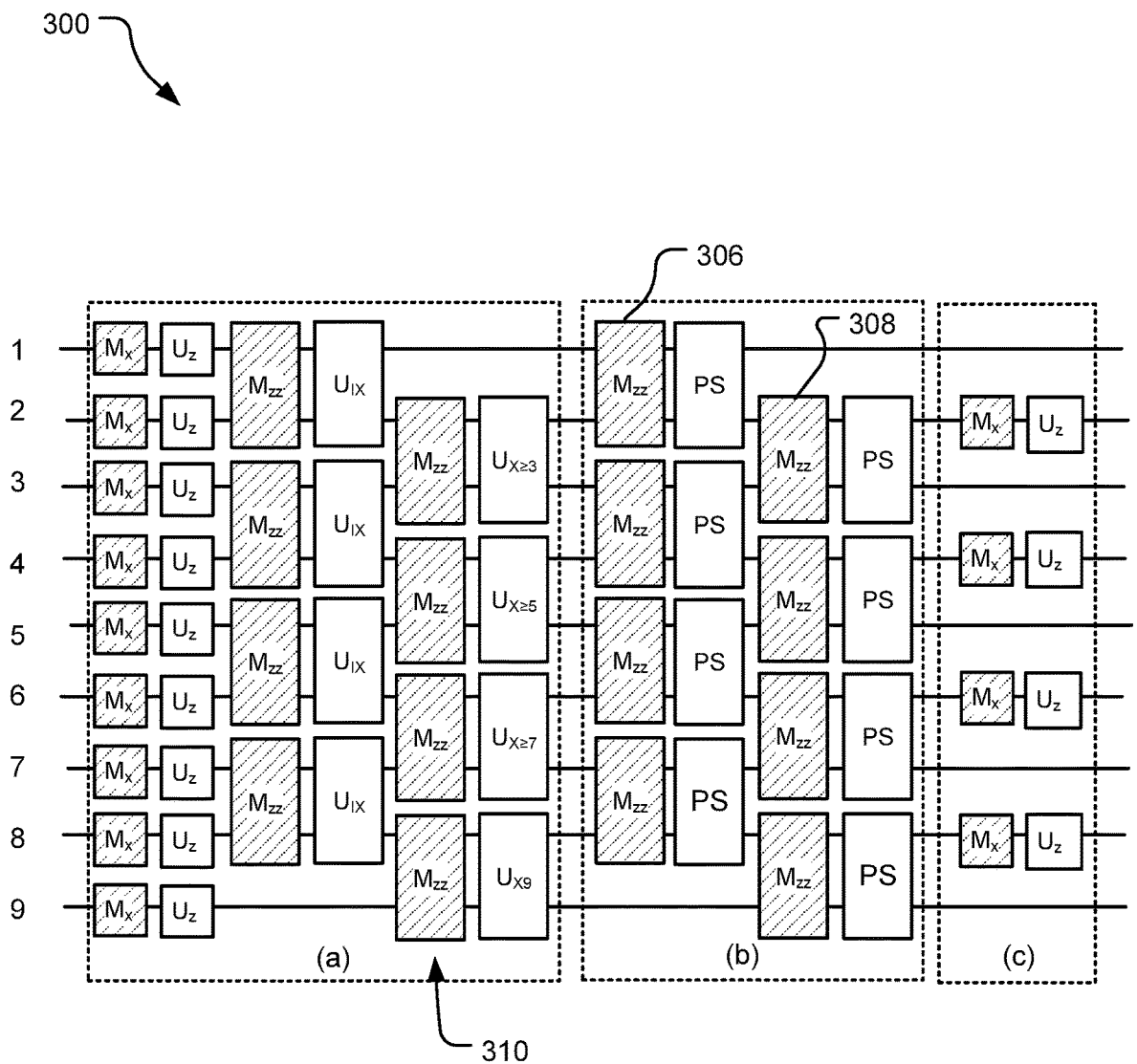
FIG. 3 illustrates another example short depth fault-tolerant cat state preparation circuit.

FIG. 3 illustrates a fault-tolerant cat state preparation circuit 300 that includes three phases (a), (b), and (c). The first phase (a) of the fault-tolerant cat state preparation circuit 300 is a cat state preparation phrase. In this phase, an initial cat state is prepared using N qubits in a line, such as in a manner consistent with the above description pertaining to operations of the cat state preparation circuit 202 of FIG. 2. A secondary phase (b) of the fault-tolerant cat state preparation circuit 300 is a post-selection phase. In this phase, a sequence of joint parity measurements is performed. This sequence entails performing a z-basis joint parity measurement ($M_{zz}$) on every pair of neighboring qubits in the series (a first round of measurement includes joint parity measurements of pairs [q1, q2], [q3,q4], [q5,q6], [q7,q8] and a second, subsequent round of measurement includes joint parity measurements of [q2,q3], [q4,q5], [q6, q7], [q8,q9]). Following each one of the two rounds of joint parity measurements, a post-selection (PS) decision step assesses the measurement outcome. If the measurement outcome is non-trivial ('1'), the cat state is rejected and the entire circuit is repeated. Otherwise, the circuit proceeds to the next round of measurement.

At completion of the second round of phase (b) (e.g., when all the 8 of the illustrated joint parity measurements have resulted in trivial outcomes), a tertiary phase(c) of the fault tolerant cat state preparation circuit 300 measures the even-numbered qubits (e.g., the cat ancillas of FIG. 2B) in the x-basis, thus destroying the data and thereby disentangling those qubits from the cat state, leaving behind a final prepared cat state supported by the odd-numbered qubits. By tracing out every other qubit in block (c), one discards correlated errors introduced during the last layer of joint measurements.

In the example of FIG. 3, the fault-tolerant cat preparation circuit 300 (comprising phases (a), (b), and (c)) has a total depth of 6 (e.g., there are six total rounds of measurement operations). In phase (a), there are 3 rounds of measurement; in phase (b), there are two rounds of measurement; and in phase (c), there is one round of measurement.

As will be discussed via mathematical proof below, the design of the fault-tolerant cat preparation circuit 300 (specifically, phases (b) and (c)) is sufficient to guarantee that the prepared cat state includes only single qubit faults to within a predefined degree of certainty. If, for example, the probability of observing a fault in a measurement is given by p, where p=0.001, 0.0001 or event smaller, the probability of observing a two or more qubit fault is on the order of p*p (extremely small). Single qubit faults in the fault-tolerant cat preparation circuit 300 may, in turn, be corrected by executing an error correction code that is 1-fault tolerant.

The depth (6) of the fault-tolerant cat state preparation circuit 300 can therefore be expressed as 4+2t, where 't' refers to the maximum fault tolerance of the circuit (e.g., in this example, 1 fault). A family of circuits can be derived as a generalization of FIG. 3A, as evidenced by the following proposition and proof:

Proposition 1. One can prepare an m-qubit cat state on a line of qubits using m−1 ancilla qubits with a t-fault-tolerant circuit with depth 4+2δ where $$\delta = \left[\min\left(t, \left\lceil \frac{m}{2} - 1 \right\rceil\right)\right].$$

The rejection probability of the circuit is proportional to Ntp where p is the maximum fault probability over fault locations.

The m-qubit cat state of proposition 1 be achieved by using a line of qubits with one-dimensional connectivity. In this approach, the cat state is prepared on an arbitrary subset of connected qubits.

Proof of Proposition 1: Since two Z-errors on the output cat state cancel out, it is sufficient to consider x-errors in isolation.

To prove that FIG. 3 is fault-tolerant up to 1-fault, note that all amplified single faults existing in the circuit output are from circuit block (a). These single faults propagate as a Pauli error $x_i x_{i+1} \ldots x_N$ where N is the number of qubits in the initial cat state, with a non-trivial X-part at the end of phase (a) of the circuit. (The Z-part of this error may be ignored here). Notably, two x-type errors affecting a measurement return a trivial syndrome. Thus, a single-qubit error in the initial cat state may go undetected in two consecutive measurements only if at least one of the two measurements contains a fault. This scenario is probabilistically rare. Thus, the second round of measurement in phase (b) effectively serves to catch errors potentially introduced in the first round of measurement in phase (b).

Notably, a single Pauli fault in the second measurement of phase (b) of the circuit may act on two qubits but one of these two qubits is discarded at the end of the circuit; thus, phase (b) and (c) ensure that no new correlated errors may be introduced after preparation of the initial cat state (phase (a) in FIG. 3).

In order to reach the circuit output, a Pauli error from block (a) of FIG. 3 must propagate through the post-selection block (b) of FIG. 3 with only trivial measurement outcomes. This requires at least one fault for each pair of consecutive post-selection measurements (e.g., a pair formed by measurements 306, 308). Overall, t additional faults are therefore necessary to propagate an amplified fault without rejection. This shows that the minimum weight of a non-rejected amplified fault configuration is at least t+1, proving that the circuit is t-fault-tolerant.

If t>[m/2−1], one can stop after [m/2−1] pairs of detection layers since the maximum weight of a Pauli error affecting the output cat state is [m/2] up to a stabilizer. For the cat state to be rejected, at least one fault must occur. A union bound provides the bound on the rejection probability.

The measurement update of the third level 310 of block (a) involves a large number of qubits. Although this update may spread errors, only X-type errors are amplified. This is why only Z-type measurements are used in the post-selection block.

When the cat state preparation is part of a fault tolerant scheme based on a stabilizer code with minimum distance d, the value t=(d±1) is recommended. Thus, a constant depth t-fault-tolerant circuit can be obtained for bounded cat state preparation. This is particularly relevant for measuring the stabilizer generators of quantum LDPC codes.

Figure 4A:
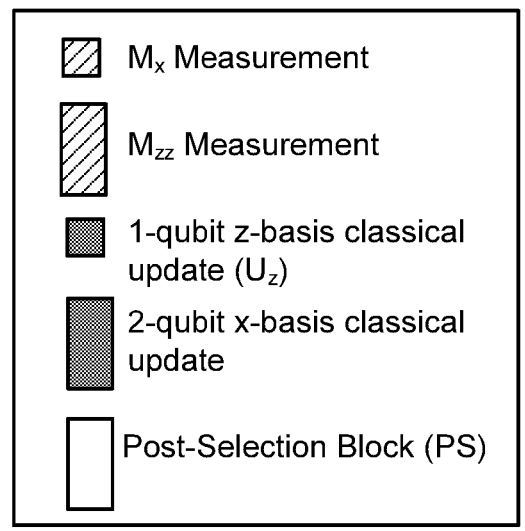
FIG. 4A illustrates an example cat state preparation circuit that is t-fault-tolerant and with depth 4+2t.
Figure 4A:
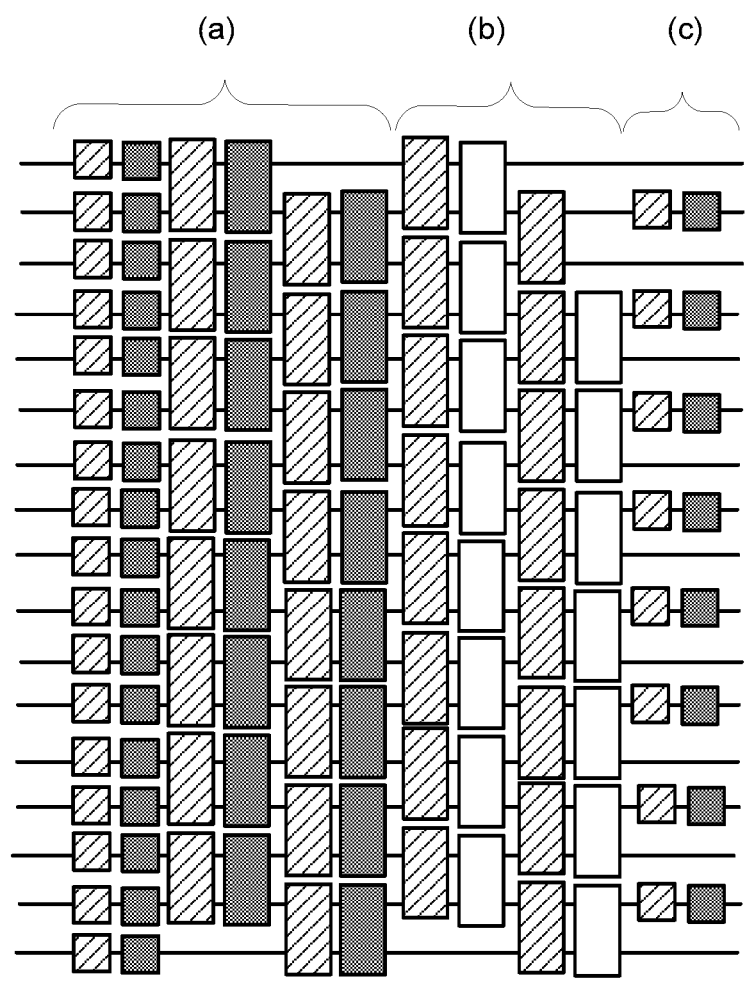
Figure 4B:
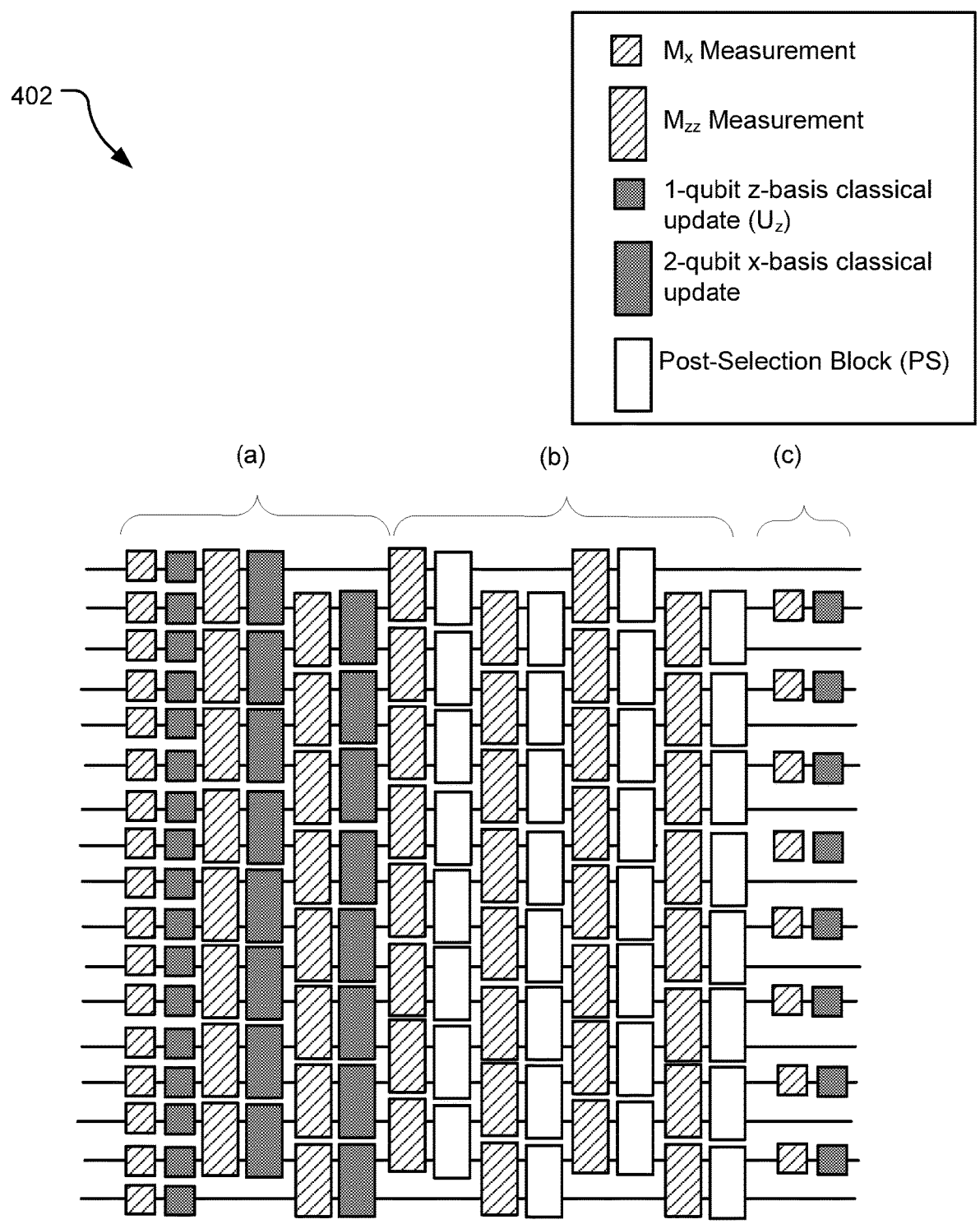
FIG. 4B illustrates another example cat state preparation circuit that is t-fault-tolerant with a depth 4+2t.
Figure 4C:
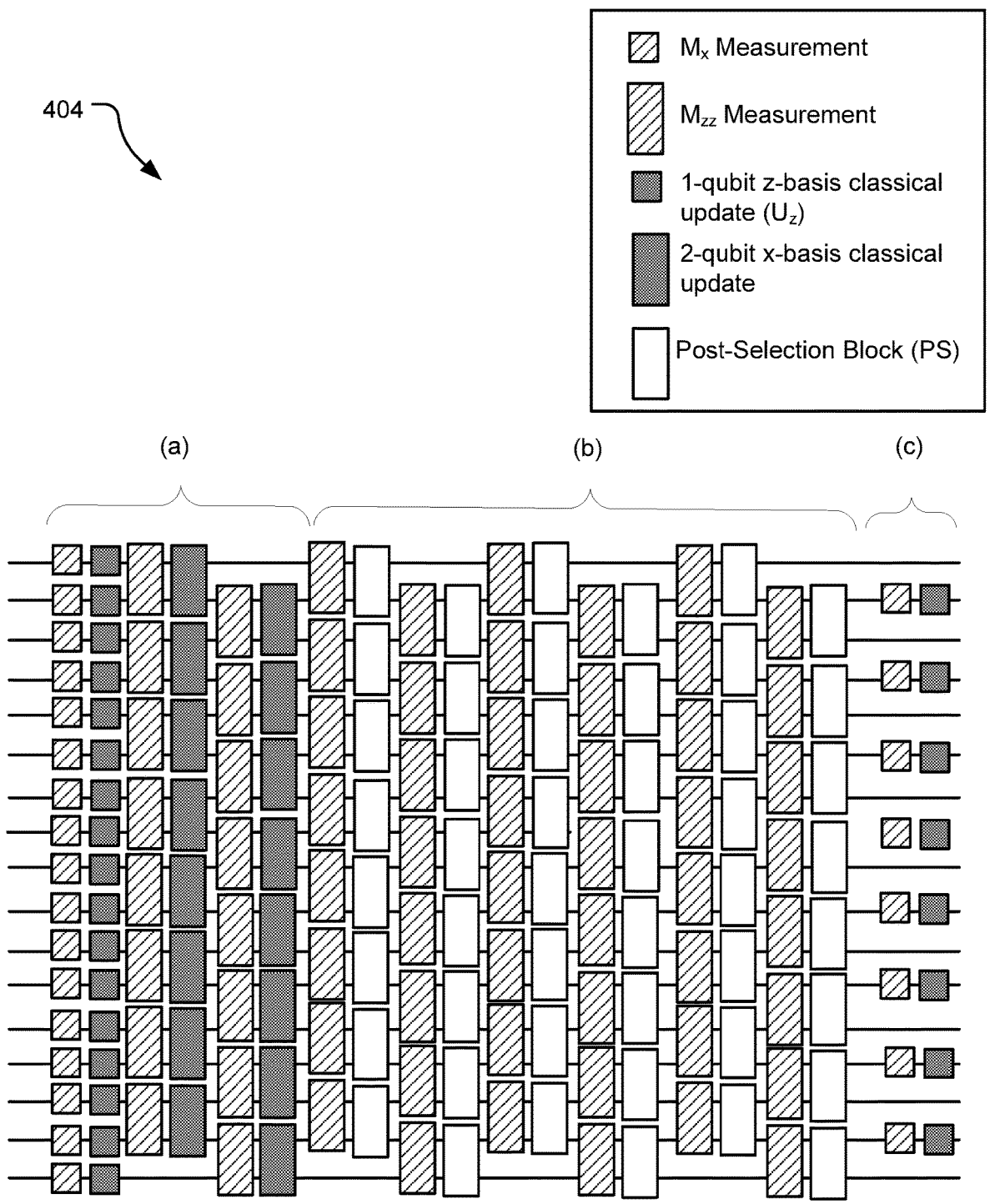
FIG. 4C illustrates yet another example cat state preparation circuit that is t-fault-tolerant with a depth 4+2t.

The circuits shown in FIG. 4A-4C further exemplify the family of t-fault tolerant circuits that may be developed from the foregoing principles.

FIGS. 4A, 4B, and 4C illustrate a family of cat preparation circuits 400, 402, and 404 that are each t-fault tolerant and that have a depth 4+2t. Specifically, the cat preparation circuit 400 of FIG. 4A has a fault tolerance of 1 and a depth of 4+2(1)=6. In contrast, the cat preparation circuit 402 of FIG. 4B has a fault tolerance of 2 and a depth of 4+2(2)=8. The cat preparation circuit 404 of FIG. 4C has a fault tolerance of 3 and a depth of 4+2(3)=10.

Each of the three FIGS. 4A, 4B, and 4C, circuit denotes the three phases discussed above with respect to FIG. 3 including (a) initial cat state preparation; (b) post-selection; and (c) disentangling the even-numbered qubits from the final prepared cat state. The circuits 4A, 4B, and 4C are identical except for varied numbers of rounds of measurement and post-selection in phase (b), which accounts for the resulting variation in fault tolerance provided by each circuit.

The "post-selection" phase (phase b) improves the quality of states produced by a circuit. However, if the rejection rate is large (e.g., when measurements yield non-trivial outcomes, causing rejection and restart of the circuit), the initial cat state preparation phase (a) may be performed multiple times before succeeding. In this regime, it may be more efficient to try to classically correct a measured quantum state measured in phase (b) with a non-trivial outcome instead of restarting the preparation from scratch. FIG. 5 illustrates a family of circuits that uses error correction to classically correct errors in the initial cat state instead of rejecting the state and starting over at each non-trivial measurement outcome in phase (b). This circuit family may be therefore understood as a "rejection-free" version of the family introduced in FIG. 3-4.

Figure 5A:
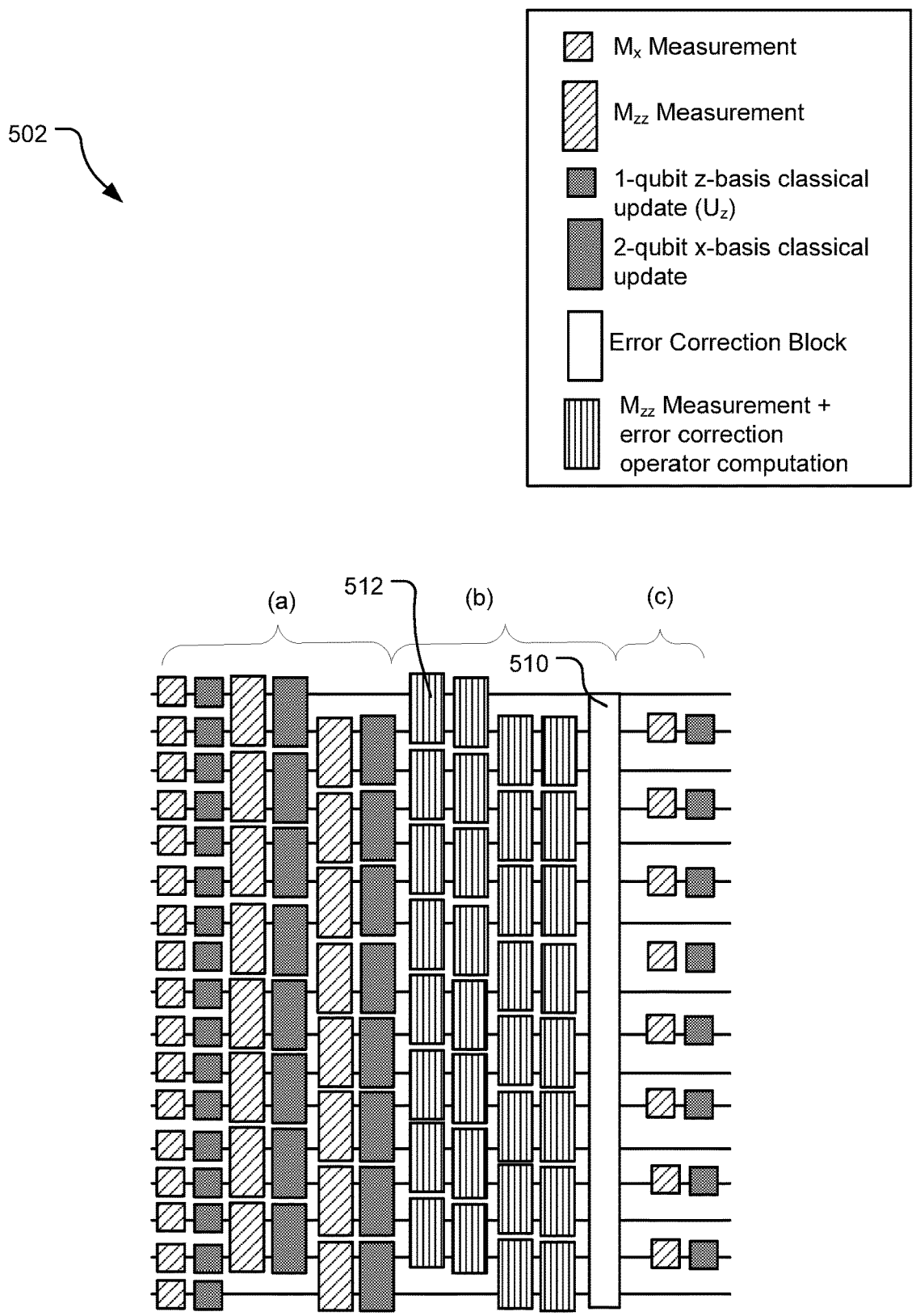
FIG. 5A illustrates an example rejection-free fault-tolerant cat state preparation circuit that is t-fault-tolerant with a depth 4+4t.
Figure 5B:
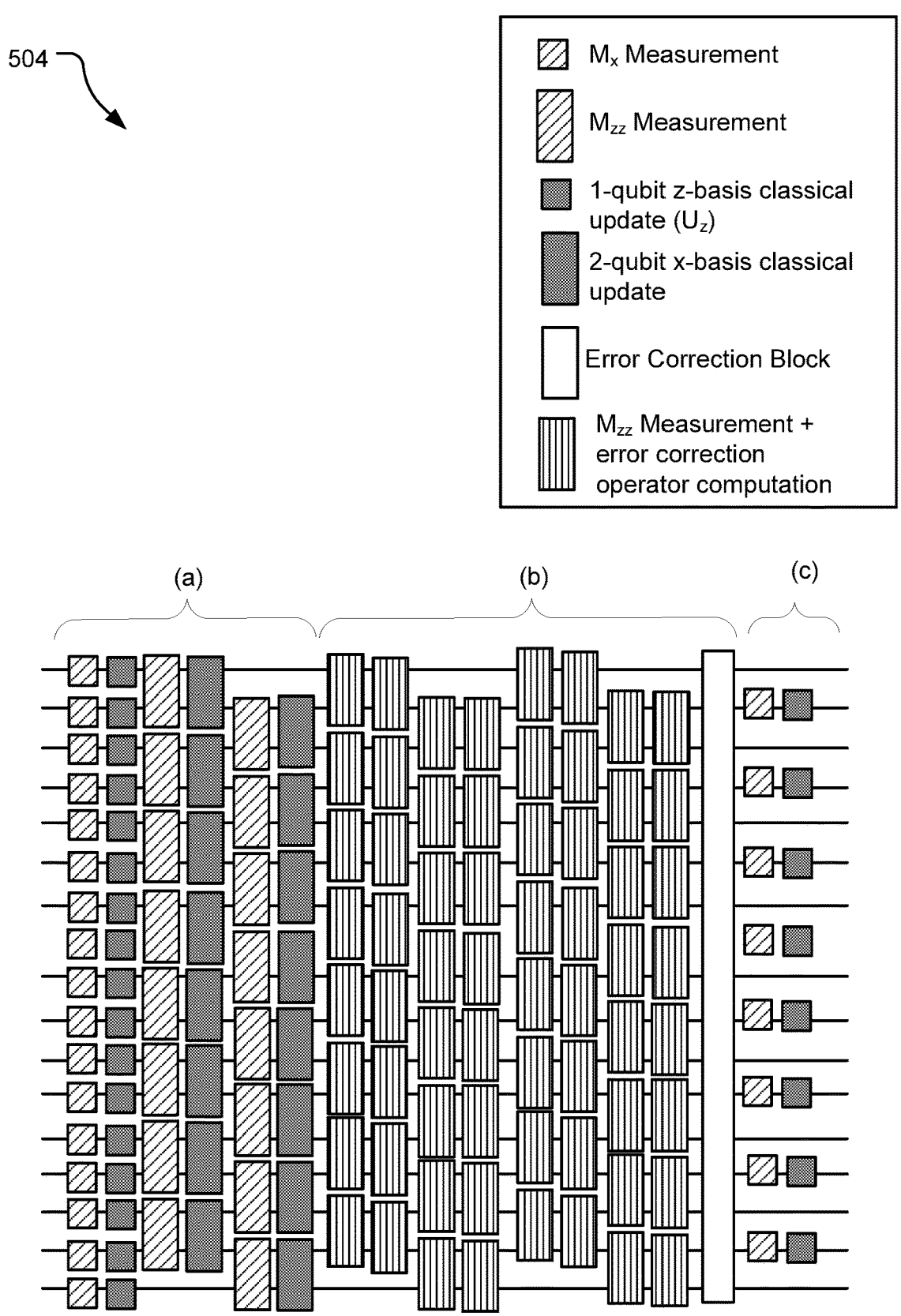
FIG. 5B illustrates another example rejection-free fault-tolerant cat state preparation circuit that is t-fault-tolerant with a depth 4+4t.
Figure 5C:
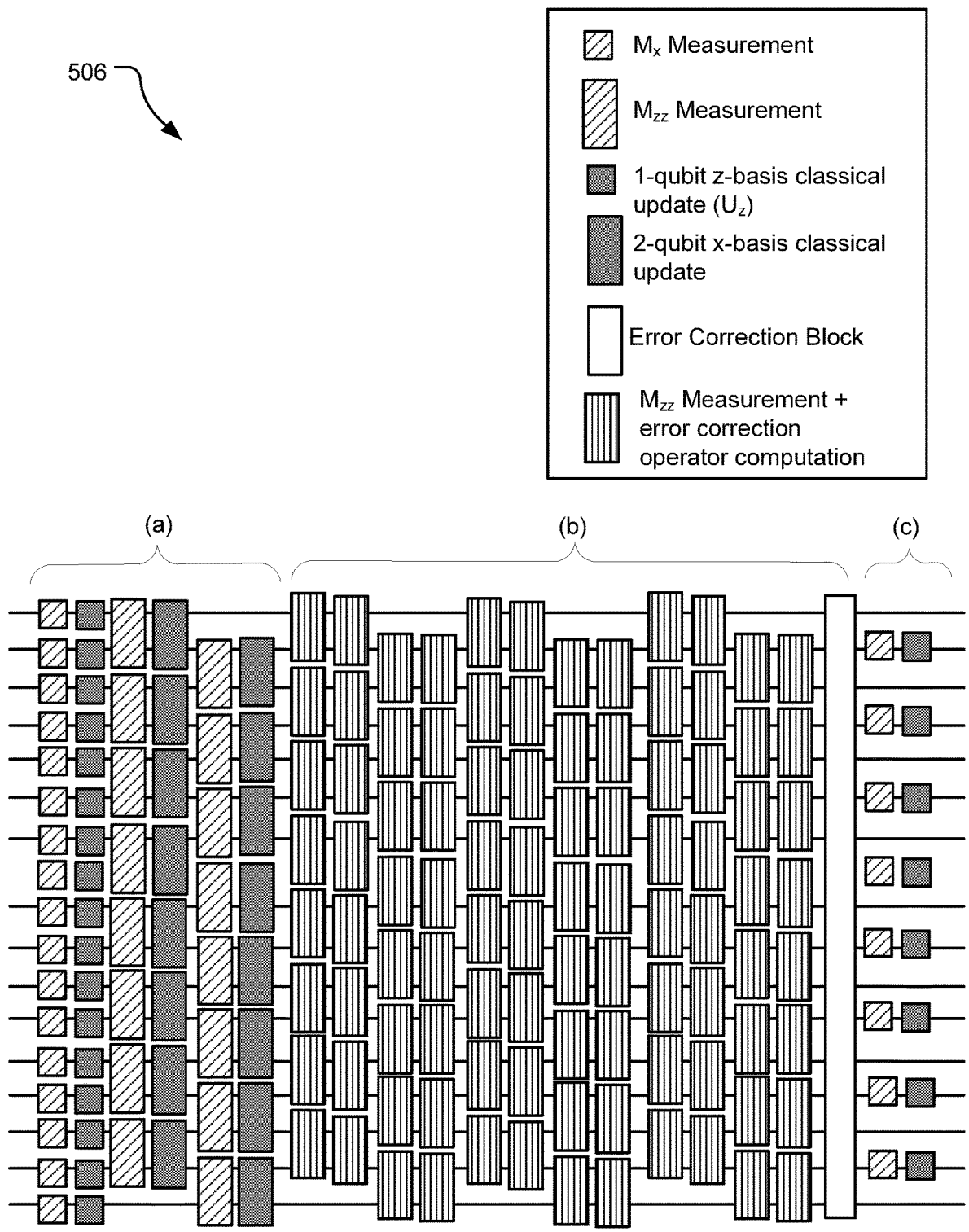
FIG. 5C illustrates yet another example rejection-free fault-tolerant cat state preparation circuit that is t-fault-tolerant with a depth 4+4t.

FIG. 5A-5C illustrate a family of rejection-free fault-tolerant cat state preparation circuits 502, 504, 506 that each provide a fault tolerance t and are of depth 4+4t. Like the circuits discussed above with respect to FIGS. 3 and 4A-4C, the rejection-free fault-tolerant cat preparation circuits 502, 504, and 506 each include three phases (a), (b), and (c). The first phase (a) is an initial cat state preparation phase, which includes operations the same or similar to those discussed above with respect to FIG. 2-4. The second phase (b) is a testing and classical correction phase that includes the same type of measurements ($M_{zz}$) used in the post-selection phase (b) of FIG. 3-4; however, the post-selection (PS) rectangles are, in FIG. 5A-5C, replaced by a correction rectangle (e.g., a correction rectangle 510 in FIG. 5A) at the end of phase (b). Moreover, the measurement rectangles in phase (b) (e.g., rectangle 512) represent both a corresponding z-basis joint parity measurement ($M_{zz}$) and a classical correction (an N-qubit Pauli operator) that may be applied to the quantum state of one or more qubits to transform the measurement outcome from non-trivial to trivial.

Referring to FIG. 5A. the correction rectangle 510 at the end of phase (b) is an N-qubit Pauli operation that depends on the output of all the joint parity ($M_{zz}$) measurements in phase (b). The correction rectangle 510 receives as an input both (1) the outcomes of the measurements performed in phase (b) and also calculated classical correction (e.g., the N-qubit Pauli operation) associated with each measurement outcome.

Each of one of the rejection-free fault-tolerant cat state preparation circuits 502 of FIG. 5A, 504 of FIG. 5B, and 506 of FIG. 5C is t-fault tolerant and has a depth 4+4t. This is because the testing phase of these circuits (phase (b)) involves twice as many measurements as compared to the post-selection phase of the circuits shown and described with respect to FIG. 3-4. This duplication of measurements within phase (b) allows for an accurate determination of the classical correction to apply at the end of the phase (e.g., the in correction rectangle 510).

Proposition 2. One can prepare an m-qubit cat state on a line of qubits using m−1 ancilla qubits with a t-fault-tolerant circuit with depth 4+4δ where $$\delta = \left\lceil \min\left(t, \left\lceil \frac{m}{2} - 1 \right\rceil\right) \right\rceil.$$

The circuit is rejection free.

Proof of Proposition 2: This proof relies on the same baseline arguments as the proof above for proposition 1. Namely, in order for an error from phase (a) of the circuit to remain undetected throughout phase (b), there must exist at least one fault per pair of consecutive levels of measurement. The goal of the correction rectangle 510 is to identify the residual error induced by any fault configuration with up to t faults. If the correction fails, that means that a residual error E for a fault configuration ω is confused with the residual error E' for another fault configuration ω'. This combined configuration ω+ω' contains at most ω+ω'<2t+1 faults, leading to trivial outcomes in phase (b) and a non-trivial residual Pauli error on the output state. This scenario cannot occur when 4t measurement layers are used in phase (b).

Figure 6A:
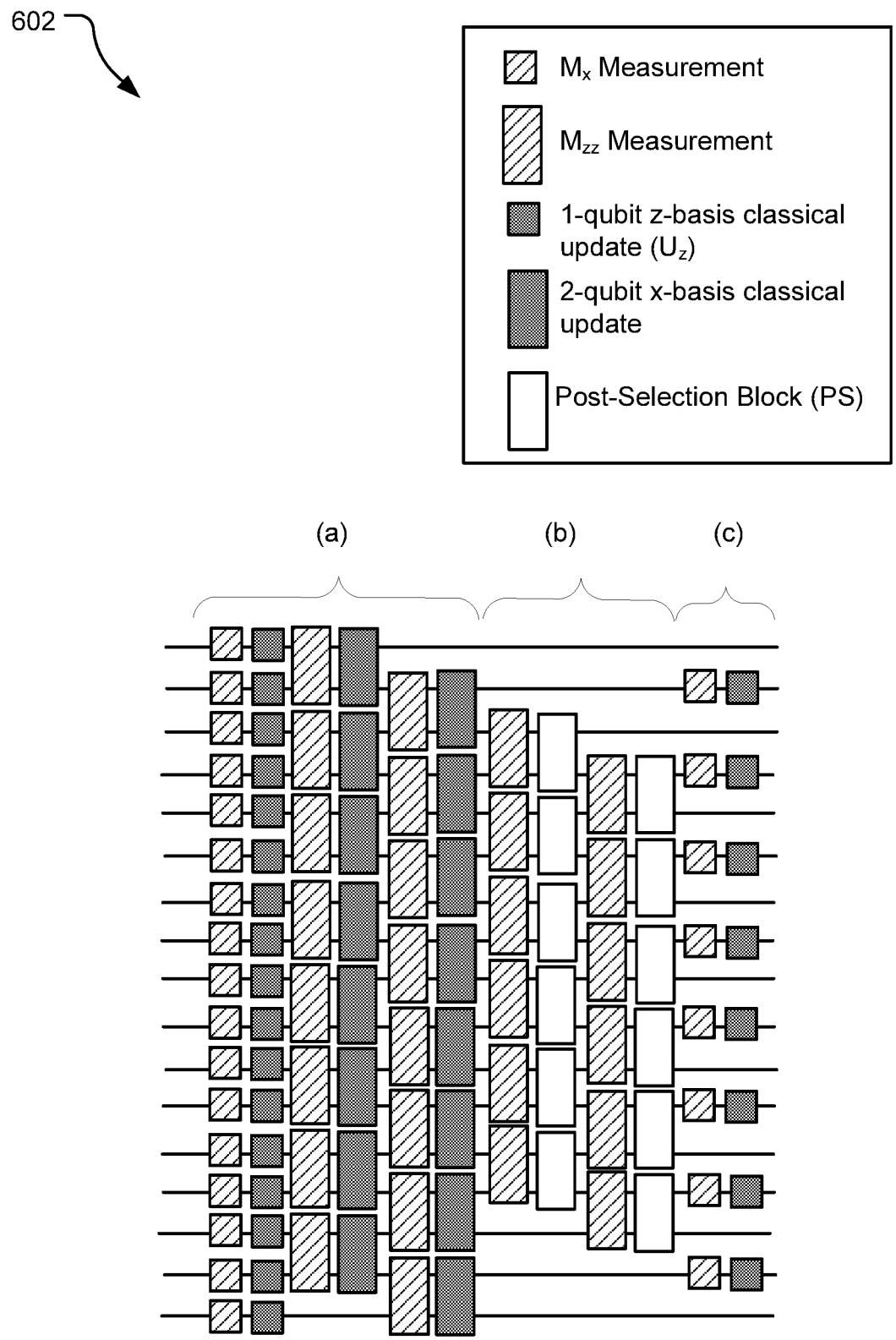
FIG. 6A illustrates an example cat state preparation circuit of reduced size as compared to FIG. 4A-4C that is t-fault-tolerant and of depth 4+2t.
Figure 6B:
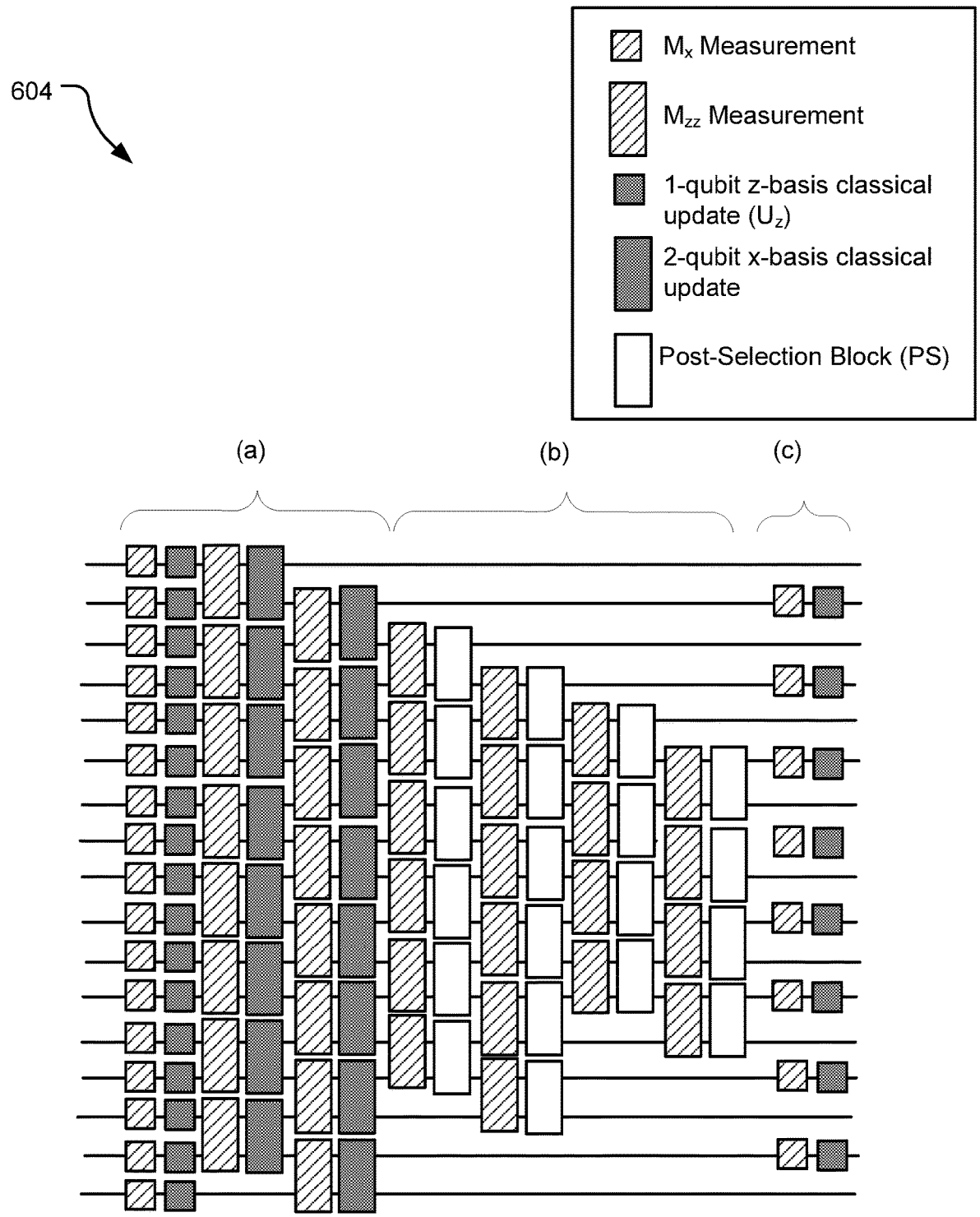
FIG. 6B illustrates another example cat state preparation circuit of reduced size as compared to FIG. 4A-4C that is t-fault-tolerant and of depth 4+2t.
Figure 6C:
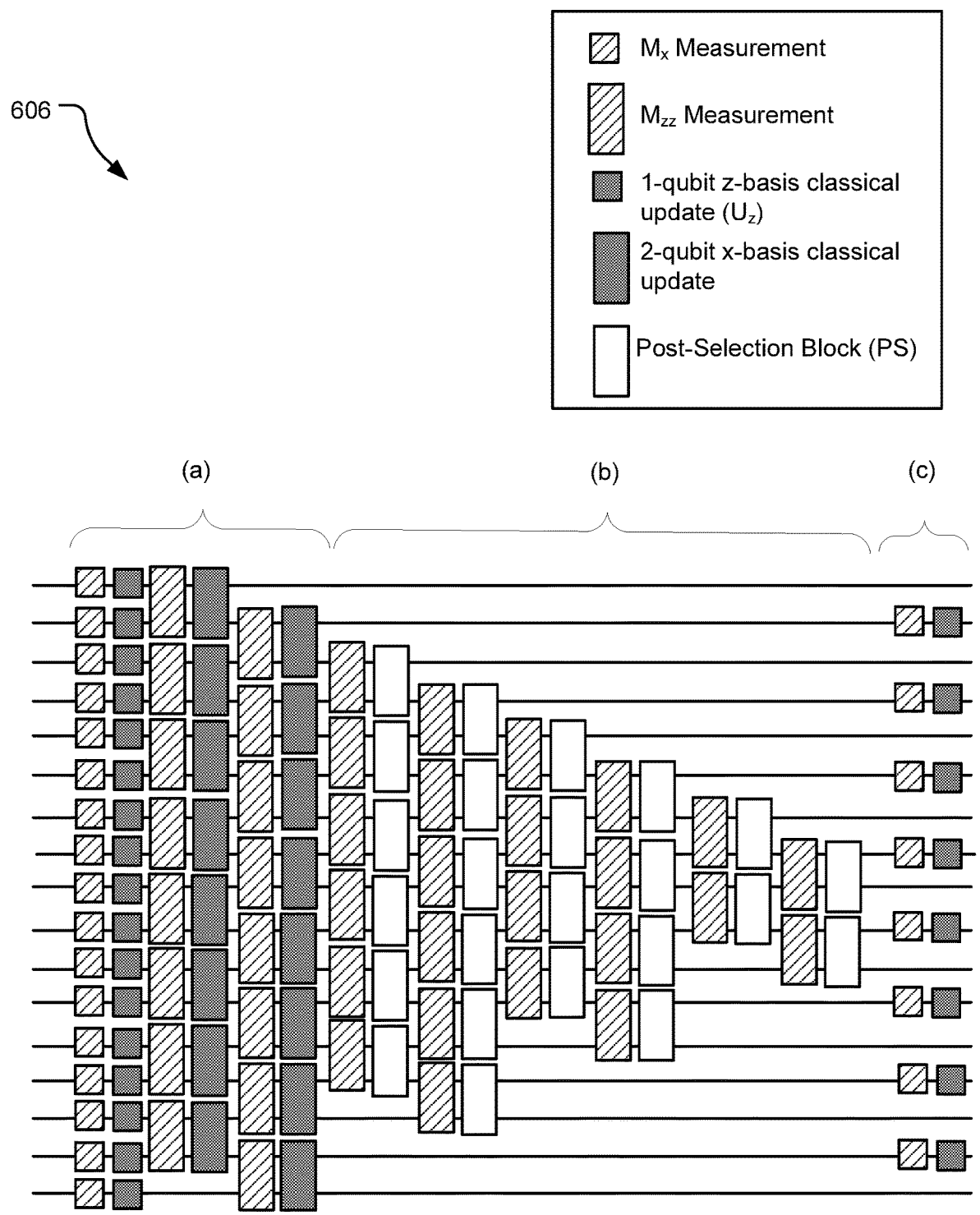
FIG. 6C illustrates yet another example cat state preparation circuit of reduced size as compared to FIG. 4A-4C that is t-fault-tolerant and of depth 4+2t.

FIG. 6A-6C illustrate a family of cat state preparation circuits 602, 604, 606 that each provide a fault tolerance t and are of depth 4+2t and that each have a reduced circuit size as compared to similar circuits disclosed with respect to FIG. 4A-4C. The cat state preparation circuits 602, 604, and 606 are obtained from the circuits of FIG. 4A-4C by deleting unnecessary post-selection measurements. The circuit 602 of FIG. 6A is a 1-fault-tolerant circuit; The circuit 604 of FIG. 6B is a 2-fault-tolerant circuit; and the circuit 606 of FIG. 6C is t-fault-tolerant for all t≥3 in the case of a 9-qubit cat state.

Notably, each measurement of the circuit introduces some additional noise. It is reasonable to expect that waiting qubits suffer from less errors than measured qubits. The only difference between the family of circuits in FIG. 6A-6C and FIG. 4A-4C is that the post-selection measurements involving the first two qubits and the last two qubits of the line are deleted. A single fault that leads to an error on these qubits is not detected anymore. This is acceptable because a single qubit fault leads to a single qubit Pauli error on the output state (up to a stabilizer) which does not violate the fault tolerance condition. Extending this argument to the configurations of 2 and 3 faults leads to the circuit of FIGS. 4B and 4C.

Figure 7:
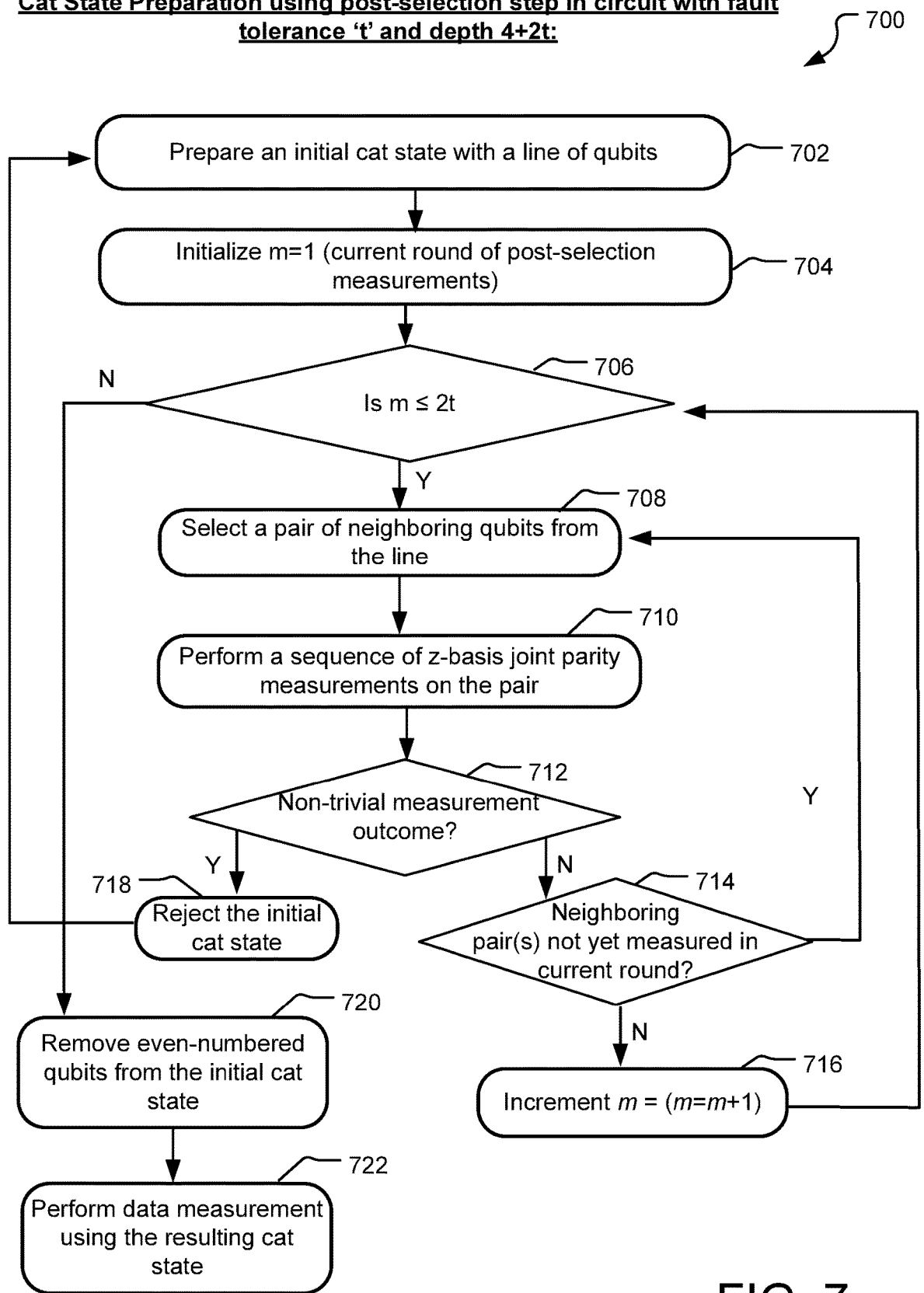
FIG. 7 illustrates example operations for preparing a cat state using a post-selection technique in a circuit of fault tolerance t and depth 4+2t.

FIG. 7 illustrates example operations 700 for preparing a cat state using a post-selection technique in a circuit of fault tolerance t and depth 4+2t. A preparing operation 702 prepares an initial cat state of a line of qubits. An initialization operation initializes an index for the current round of measurement (m=1) that is about to begin. A determination operation 706 initiates the measurement round responsive to determining that m is still less than or equal twice the circuit fault tolerance level.

A selection operation 708 selects a pair of neighboring qubits from the line, and a measurement operation performs a z-basis joint parity measurement on the selected pair. A determination operation 712 assesses the measurement outcome to determine whether it is non-trivial. If the measurement outcome is non-trivial ('1'), this indicates a fault in the prepared cat state and a rejection operation 718 rejects the cat state, in which case the preparation operation 702 prepares a new cat state and the operations 704, 706, 708, and 710 repeat.

Provided that the determination operation 712 determines that the measurement outcome is trivial ('0'), a determination operation 714 determines whether there exist any remaining pairs of neighboring qubits that have not yet been subjected to the measurement operation 710 in the current round of measurements (e.g., where m=1 for the first round, m=2 for the second round, etc. If neighboring qubit pairs do remain to be measured, the selection operation 708 selects a new neighboring qubit pair, and the operations 710, 712, 718, etc. repeat until all neighboring pairs have been measured in the current round 'm' and all such measurements have yielded trivial outcomes. When this condition is satisfied, an incrementation operation increments the measurement round number 'm,' commencing a new measurement round that repeats the above described operations until all of the neighboring pairs of qubits have been measured in the second round (e.g., m=2) and all such measurements have again yielded trivial outcomes. Notably, the implementations shown in FIG. 6A-6C do not perform joint parity measurements on all pairs of neighboring qubits but only a subset of those qubits (forming the triangular circuit patterning of FIG. 6A-6C). Specifically, joint parity measurements may be skipped on pairs of the neighboring qubits because faults occurring at the edge of the circuit are unable to propagate to the bulk. Consequently, these faults are less harmful than the faults in the bulk of the circuit and measurements of these faults are not required to detect and correct faults in the bulk of the circuit.

The above process is repeated for "m" rounds of measurement up to twice the fault tolerance level of the circuit. If, for example, the circuit has a fault tolerance of 1, the operations 700 perform two total rounds of joint parity measurements on all pairs of neighboring qubits. Likewise, if the circuit has a fault tolerance of 2, the operations 700 perform four total rounds of joint parity measurements on all pairs of neighboring qubits.

Once the determination operation 706 determines that the number of measurement rounds performed is equal to twice the fault tolerance level of the circuit, a disentanglement operation 720 disentangles all even-numbered qubits from the initial cat state, effectively reducing the size of the initial cat state to (N+1)/2, where N is the number of qubits in the initial cat state. A data measurement operation 722 performs a data measurement on two or more target qubits by connecting the resulting cat state to those target qubits and extracting a measurement.

Figure 8:
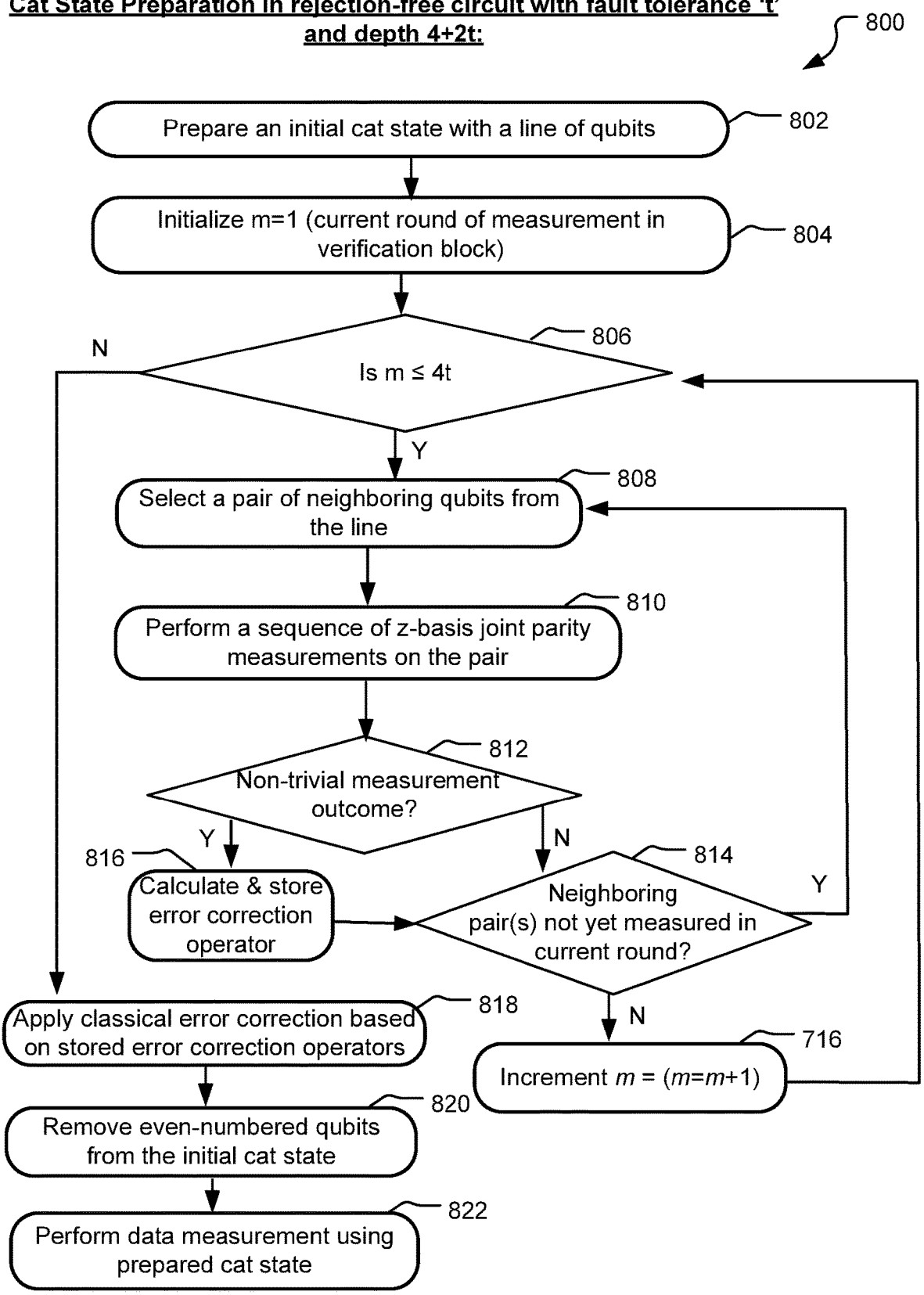
FIG. 8 illustrates example operations 800 for preparing a rejection-free cat state in a circuit of fault tolerance t and depth 4+2t.

FIG. 8 illustrates example operations 800 for preparing a rejection-free cat state (e.g., without using post-selection) in a circuit of fault tolerance t and depth 4+2t. A preparing operation 802 prepares an initial cat state of a line of qubits. An initialization operation initializes an index for the current round of measurement (m=1) that is about to begin. A determination operation 806 initiates the measurement round responsive to determining that m is still less than four times the circuit fault tolerance level.

A selection operation 808 selects a pair of neighboring qubits from the line, and a measurement operation performs a z-basis joint parity measurement on the selected pair. A determination operation 812 assesses the measurement outcome to determine whether it is non-trivial. If the measurement outcome is non-trivial ('1'), this indicates a fault in the prepared cat state. In this case, an error correction operation 816 calculates and stores a classical correction (an N-qubit Pauli operator) usable to alter a stored quantum state of one or more qubits to transform the measurement outcome from non-trivial to trivial.

Following this, (or, in all cases where the outcome of measurement operation 812 is trivial), a determination operation 814 determines whether there exist any remaining pairs of neighboring qubits that have not yet been subjected to the measurement operation 810 n the current round of measurements (e.g., where m=1 for the first round, m=2 for the second round, etc.). If neighboring qubit pairs do remain to be measured, the selection operation 808 selects a new neighboring qubit pair, and the operations 810, 812, 816, 814 repeat until all neighboring pairs have been measured in the current round 'm' and all such measurements have yielded trivial outcomes. When this condition is satisfied, an incrementation operation increments the measurement round number 'm,' commencing a new measurement round that repeats the above described operations until all of the neighboring pairs of qubits have been measured in the second round (e.g., m=2) and all such measurements have again yielded trivial outcomes.

The above process is repeated for "m" rounds of measurement up to four times the fault tolerance level of the circuit. If, for example, the circuit has a fault tolerance of 1, the operations 800 perform four total rounds of joint parity measurements and error correction calculations for all pairs of neighboring qubits. Likewise, if the circuit has a fault tolerance of 2, the operations 800 perform eight total rounds of joint parity measurements and error correction calculations on all pairs of neighboring qubits.

Once the determination operation 806 determines that the number of measurement rounds performed is equal to four time the fault tolerance level of the circuit, a classical error correction operation 818 corrects a classical-quantum state stored for each qubit based on the error correction operators computed and stored by the error correction calculation 816. A disentanglement operation 820 disentangles all even-numbered qubits from the initial cat state, effectively reducing the size of the initial cat state to (N+1)/2, where N is the number of qubits in the initial cat state. A data measurement operation 822 performs a data measurement on two or more target qubits by connecting the resulting cat state to those target qubits and extracting a measurement.

Figure 9:
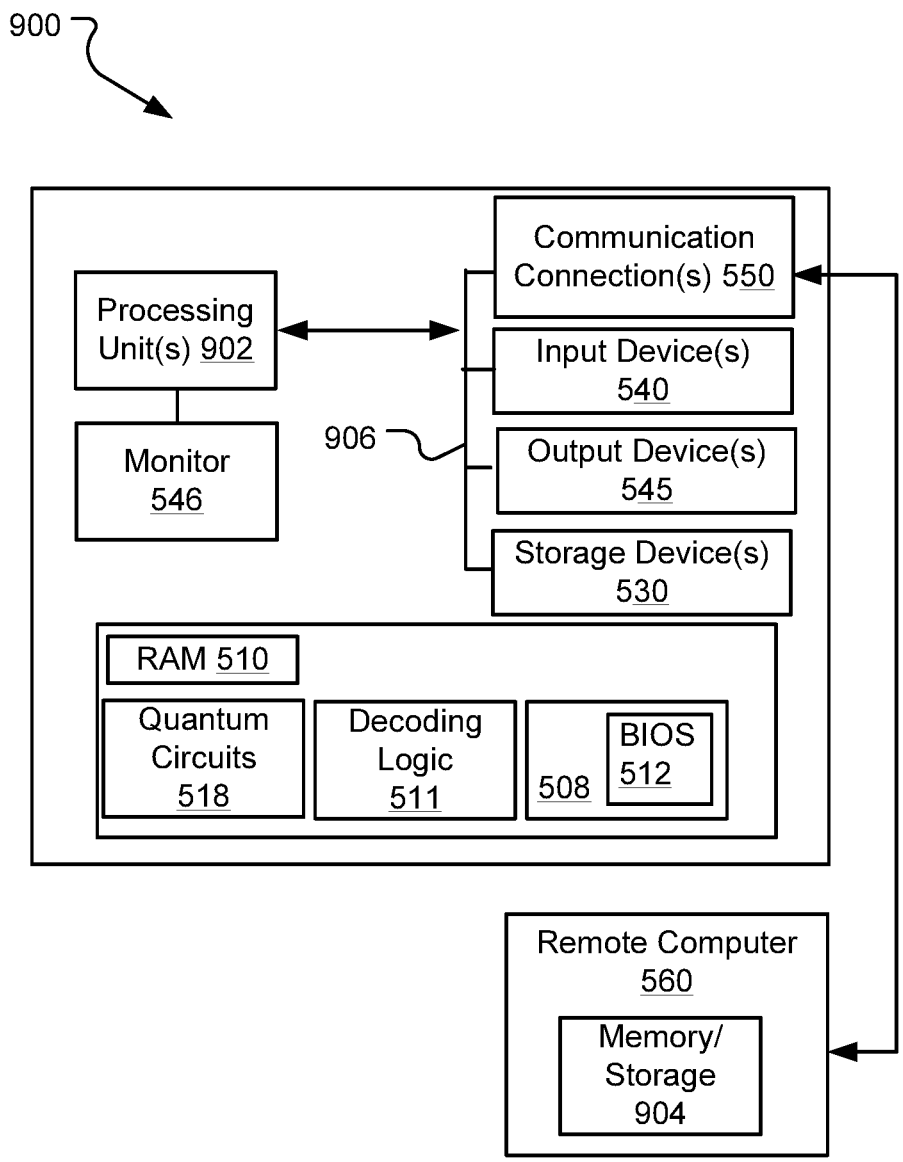
FIG. 9 illustrates exemplary computing environment suitable for implementing aspects of the disclosed technology.

FIG. 9 illustrates an exemplary system for implementing the disclosed technology that includes a general purpose computing device in the form of an exemplary conventional PC 900, including one or more processing units 902, a system memory 904, and a system bus 906 that couples various system components including the system memory 904 to the one or more processing units 902. The system bus 906 may be any of several types of bus structures including a memory bus or memory controller, a peripheral bus, and a local bus using any of a variety of bus architectures. The exemplary system memory 904 includes read only memory (ROM) 908 and random access memory (RAM) 1210. A basic input/output system (BIOS) 912, containing the basic routines that help with the transfer of information between elements within the PC 900, is stored in ROM 908.

In on implementation, the system memory 904 stores logical operations for preparing a cat state, such as those described by the operations 700 in FIG. 7 and operations 800 in FIG. 8.

The exemplary PC 900 further includes one or more storage devices 930 such as a hard disk drive for reading from and writing to a hard disk, a magnetic disk drive for reading from or writing to a removable magnetic disk, and an optical disk drive for reading from or writing to a removable optical disk (such as a CD-ROM or other optical media).-Such storage devices can be connected to the system bus 1206 by a hard disk drive interface, a magnetic disk drive interface, and an optical drive interface, respectively. The drives and their associated computer readable media provide nonvolatile storage of computer-readable instructions, data structures, program modules, and other data for the PC 1200. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 930 including an operating system, one or more application programs, other program modules, and program data. Decoding logic can be stored in the storage devices 930 as well as or in addition to the memory 904. A user may enter commands and information into the PC 900 through one or more input devices 940 such as a keyboard and a pointing device such as a mouse. Other input devices may include a digital camera, microphone, joystick, game pad, satellite dish, scanner, or the like. These and other input devices are often connected to the one or more processing units 902 through a serial port interface that is coupled to the system bus 906, but may be connected by other interfaces such as a parallel port, game port, or universal serial bus (USB). A monitor 946 or other type of display device is also connected to the system bus 906 via an interface, such as a video adapter. Other peripheral output devices 945, such as speakers and printers (not shown), may be included.

The PC 900 may operate in a networked environment using logical connections to one or more remote computers, such as a remote computer 960. In some examples, one or more network or communication connections 950 are included. The remote computer 960 may be another PC, a server, a router, a network PC, or a peer device or other common network node, and typically includes many or all of the elements described above relative to the PC 900, although only a memory storage device 962 has been illustrated in FIG. 12. The personal computer 900 and/or the remote computer 960 can be connected to a logical a local area network (LAN) and a wide area network (WAN). Such networking environments are commonplace in offices, enterprise wide computer networks, intranets, and the Internet.

When used in a LAN networking environment, the PC 1200 is connected to the LAN through a network interface. When used in a WAN networking environment, the PC 1200 typically includes a modem or other means for establishing communications over the WAN, such as the Internet. In a networked environment, program modules depicted relative to the personal computer 1200, or portions thereof, may be stored in the remote memory storage device or other locations on the LAN or WAN. The network connections shown are exemplary, and other means of establishing a communications link between the computers may be used.

An example method disclosed herein provides for performing a series of operations to prepare a cat state in a quantum circuit with fault tolerance t and circuit depth less than or equal to 4+4t. The series of operations includes at least performing a sequence of joint parity measurements on individual pairs of neighboring qubits in a series of qubits entangled to form an initial cat state; repeating the sequence of measurements over at least t-rounds; and disentangling a first set of alternating qubits from the initial cat state to form the prepared cat state with a remaining second set of alternating qubits. The second set of alternating qubits is interlaced with the first set of alternating qubits along a line of one-dimensional connectivity, and the prepared cat state is guaranteed with a predefined degree of certainty to include less than or equal to t number of faults.

An example method according to any preceding method further entails additional operations to extract a measurement of two or more data qubits using the prepared cat state. The additional operations include entangling the two or more data qubits with the prepared cat state and extracting a measurement result of the two or more data qubits from the prepared cat state.

In another example method according to any preceding method, the method further includes (1) rejecting the cat state and preparing a new cat state responsive to determining that any one of the joint parity measurements yields a non-trivial outcome; and (2) proceeding to the next round of the at least t-rounds of measurement responsive to determining that none of the joint parity measurements yields a non-trivial outcome.

In yet still another example method according to any preceding method, repeating the sequence of measurements over at least t-rounds further comprises performing 2*t-rounds of the sequence of measurements. The 2*t-rounds are sufficient to guarantee fault tolerance up to t number of faults without rejecting the cat state under any circumstances.

Yet another example method of any preceding method further comprises: for each measurement of the 2*t rounds, computing and storing an N-qubit Pauli operator usable to alter a stored quantum state of one or more of the qubits to transform the measurement outcome from non-trivial to trivial.

In still another example of method of any preceding method, the method further comprises correcting a stored quantum state of each of the qubits in series based on the computed and stored N-qubit Pauli operators following the 2*t rounds.

In yet another example method of any preceding method, the method further comprises preparing the prepared cat state by performing operations to entangle the series of qubits, the operations including: (1) performing an x-basis measurement of each one of the qubits in the series; (2) for each one of the x-basis measurements with an outcome that is non-trivial, implementing a measurement update operation to flip the outcome;(3) performing a z-basis joint parity measurement on each individual pair of neighboring qubits in the series of qubits; and for each one of the z-basis joint parity measurements with an outcome that is non-trivial, implementing a measurement update operation to flip the outcome.

In still another example of method of any preceding method, the depth of the quantum circuit is independent of qubit connectivity, size of the prepared cat sate, and distance between the qubits in the series.

An example quantum device disclosed herein includes a cat state preparation circuit with fault tolerance t and circuit depth less than or equal to 4+4t. The cat state preparation circuit is configured to prepare the cat state: perform a sequence of joint parity measurements on individual pairs of neighboring qubits in a series of qubits entangled to form an initial cat state; repeat the sequence of measurements over at least t-rounds; and disentangle a first set of alternating qubits from the initial cat state to form a prepared cat state guaranteed with a predefined degree of certainty to have less than or equal to t number of faults. The prepared cat state is formed by a remaining second set of alternating qubits, the second set of alternating qubits being interlaced with the first set of alternating qubits along a line of one-dimensional connectivity.

In another quantum device according to any preceding quantum device, the cat state preparation circuit is further configured to perform operations to extract a measurement of two or more data qubits using the prepared cat state, the operations including entangling the two or more data qubits with the prepared cat state; and extracting a measurement result of the two or more data qubits from the prepared cat state.

In another quantum device according to any preceding quantum device, the cat state preparation circuit is further configured to reject the cat state and prepare a new cat state responsive to determining that any one of the joint parity measurements yields a non-trivial outcome; and proceed to the next round of the at least t-rounds of measurement responsive to determining that none of the joint parity measurements yields a non-trivial outcome.

In still another quantum device of any preceding quantum device, the cat state preparation circuit repeats the sequence of measurements over at the least t-rounds of measurement by performing 2*t-rounds of the sequence of measurements that are collectively sufficient to guarantee fault tolerance up to t number of faults without rejecting the cat state under any circumstances.

In yet another quantum device of any preceding quantum device, the cat state preparation circuit further configured to compute and store an N-qubit Pauli operator for each measurement of the 2*t rounds. The N-qubit Pauli operator is an operator usable to alter a stored quantum state of one or more of the qubits to transform the outcome for the measurement from non-trivial to trivial.

In another quantum device of any preceding quantum device, the cat state preparation circuit is further configured to correct a stored quantum state of each of the qubits in series based on the computed and stored N-qubit Pauli operators.

In still another quantum device of any preceding quantum device, the cat state preparation circuit is further configured to prepare the prepared cat state by performing operations to entangle the series of qubits. The operations include: performing an x-basis measurement of each one of the qubits in the series; implementing a measurement update operation to flip the outcome of each one of the x-basis measurements with an outcome that is non-trivial; performing a z-basis joint parity measurement on each individual pair of neighboring qubits in the series of qubits; and implementing a measurement update operation to flip the outcome of each one of the z-basis joint parity measurements with an outcome that is non-trivial.

In another quantum device of any preceding quantum device, the depth of the cat state preparation circuit is independent of qubit connectivity, size of the prepared cat sate, and distance between the qubits in the series.

An example tangible computer-readable storage media disclosed herein stores processor-executable instructions for executing a computer process to prepare a cat state in a quantum circuit with fault tolerance t and circuit depth less than or equal to 4+4t. The computer process includes: performing a sequence of joint parity measurements on individual pairs of neighboring qubits in a series of qubits entangled to form an initial cat state repeating the sequence of measurements over at least t-rounds; and disentangling a first set of alternating qubits from the initial cat state to form the prepared cat state with a remaining second set of alternating qubits. The second set of alternating qubits is interlaced with the first set of alternating qubits along a line of one-dimensional connectivity. The prepared cat state is guaranteed with a predefined degree of certainty to include fewer than t number of faults.

In another example computer-readable storage media according to any preceding storage media, the computer process further comprises: rejecting the cat state and preparing a new cat state responsive to determining that any one of the joint parity measurements yields a non-trivial outcome; and proceeding to the next round of the at least t-rounds of measurement responsive to determining that none of the joint parity measurements yields a non-trivial outcome.

In another example computer-readable storage media according to any preceding storage media, the computer process further comprises performing 2*t-rounds of the sequence of measurements. The 2*t-rounds being sufficient to guarantee with a predefined degree of certainty fault tolerance up to t number of faults without rejecting the cat state under any circumstances.

In another example computer-readable storage media according to any preceding storage media, the computer process further comprises: for each measurement of the 2*t rounds, computing and storing an N-qubit Pauli operator usable to alter a stored quantum state of one or more of the qubits to transform an outcome of the measurement from non-trivial to trivial.

An example system d disclosed herein includes a means for performing a series of operations to prepare a cat state in a quantum circuit with fault tolerance t and circuit depth less than or equal to 4+4t. The system includes at least a means for performing a sequence of joint parity measurements on individual pairs of neighboring qubits in a series of qubits entangled to form an initial cat state; a means for repeating the sequence of measurements over at least t-rounds; and a means for disentangling a first set of alternating qubits from the initial cat state to form the prepared cat state with a remaining second set of alternating qubits. The second set of alternating qubits is interlaced with the first set of alternating qubits along a line of one-dimensional connectivity, and the prepared cat state is guaranteed with a predefined degree of certainty to include less than or equal to t number of faults.

The above specification, examples, and data provide a complete description of the structure and use of exemplary implementations. Since many implementations can be made without departing from the spirit and scope of the claimed invention, the claims hereinafter appended define the invention. Furthermore, structural features of the different examples may be combined in yet another implementation without departing from the recited claims. The above specification, examples, and data provide a complete description of the structure and use of exemplary implementations. Since many implementations can be made without departing from the spirit and scope of the claimed invention, the claims hereinafter appended define the invention. Furthermore, structural features of the different examples may be combined in yet another implementation without departing from the recited claims.

What is claimed is:

1. A method comprising:
performing a series of operations to prepare a cat state in a quantum circuit with fault tolerance t and circuit depth less than or equal to 4+4t, series of operations including at least:
performing a sequence of joint parity measurements on individual pairs of neighboring qubits in a series of qubits entangled to form an initial cat state;
repeating the sequence of measurements over at least t-rounds; and
disentangling a first set of alternating qubits from the initial cat state to form the prepared cat state with a remaining second set of alternating qubits, the second set of alternating qubits being interlaced with the first set of alternating qubits along a line of one-dimensional connectivity, the prepared cat state being guaranteed with a predefined degree of certainty to include less than or equal to t number of faults.

2. The method of claim 1, further comprising:
performing additional operations to extract a measurement of two or more data qubits using the prepared cat state, the additional operations including:
entangling the two or more data qubits with the prepared cat state; and
extracting a measurement result of the two or more data qubits from the prepared cat state.

3. The method of claim 1, further comprising:
responsive to determining that any one of the joint parity measurements yields a non-trivial outcome, rejecting the cat state and preparing a new cat state; and
proceeding to the next round of the at least t-rounds of measurement responsive to determining that none of the joint parity measurements yields a non-trivial outcome.

4. The method of claim 1, wherein repeating the sequence of measurements over at least t-rounds further comprises:
performing 2*t-rounds of the sequence of measurements, the 2*t-rounds being sufficient to guarantee with the predefined degree of certainty fault tolerance up to t number of faults without rejecting the cat state under any circumstances.

5. The method of claim 4, further comprising:
for each measurement of the 2*t rounds, computing and storing an N-qubit Pauli operator usable to alter a stored quantum state of one or more of the qubits to transform the measurement outcome from non-trivial to trivial.

6. The method of claim 5, further comprising:
following the 2*t rounds, correcting a stored quantum state of each of the qubits in series based on the computed and stored N-qubit Pauli operators.

7. The method of claim 1, further comprising:
preparing the prepared cat state by performing a sequence of operations to entangle the series of qubits, the sequence of operations comprising:
performing an x-basis measurement of each one of the qubits in the series;
for each one of the x-basis measurements with an outcome that is non-trivial, implementing a measurement update operation to flip the outcome;
performing a z-basis joint parity measurement on each individual pair of neighboring qubits in the series of qubits; and
for each one of the z-basis joint parity measurements with an outcome that is non-trivial, implementing a measurement update operation to flip the outcome.

8. The method of claim 1, wherein the depth of the quantum circuit is independent of qubit connectivity, size of the prepared cat sate, and distance between the qubits in the series.

9. A quantum device comprising:
a cat state preparation circuit with fault tolerance t and circuit depth less than or equal to 4+4t, the cat state preparation circuit configured to:

perform a sequence of joint parity measurements on individual pairs of neighboring qubits in a series of qubits entangled to form an initial cat state;

repeat the sequence of measurements over at least t-rounds; and disentangle a first set of alternating qubits from the initial cat state to form a prepared cat state that is guaranteed with a predefined degree of certainty to include less than or equal to t number of faults, the prepared cat state being formed by a remaining second set of alternating qubits, the second set of alternating qubits being interlaced with the first set of alternating qubits along a line of one-dimensional connectivity.

10. The quantum device of claim 9, wherein the cat state preparation circuit is further configured to:

perform operations to extract a measurement of two or more data qubits using the prepared cat state, the operations including:

entangling the two or more data qubits with the prepared cat state; and extracting a measurement result of the two or more data qubits from the prepared cat state.

11. The quantum device of claim 9, wherein the cat state preparation circuit is further configured to:

responsive to determining that any one of the joint parity measurements yields a non-trivial outcome, reject the cat state and prepare a new cat state; and proceed to the next round of the at least t-rounds of measurement responsive to determining that none of the joint parity measurements yields a non-trivial outcome.

12. The quantum device of claim 9, wherein the cat state preparation circuit repeats the sequence of measurements over at the least t-rounds of measurement by:

performing 2*t-rounds of the sequence of measurements, the 2*t-rounds being sufficient to guarantee with the predefined degree of certainty fault tolerance up to t number of faults without rejecting the cat state under any circumstances.

13. The quantum device of claim 12, wherein the cat state preparation circuit is further configured to:

compute and store an N-qubit Pauli operator for each measurement of the 2*t rounds, the N-qubit Pauli operator being usable to alter a stored quantum state of one or more of the qubits to transform the outcome for the measurement from non-trivial to trivial.

14. The quantum device of claim 13, wherein the cat state preparation circuit is further configured to:

correct a stored quantum state of each of the qubits in series based on the computed and stored N-qubit Pauli operators.

15. The quantum device of claim 9, wherein the cat state preparation circuit is further configured to:

prepare the prepared cat state by performing a sequence of operations to entangle the series of qubits, the sequence of operations comprising:

perform an x-basis measurement of each one of the qubits in the series;

for each one of the x-basis measurements with an outcome that is non-trivial, implementing a measurement update operation to flip the outcome;

perform a z-basis joint parity measurement on each individual pair of neighboring qubits in the series of qubits; and for each one of the z-basis joint parity measurements with an outcome that is non-trivial, implement a measurement update operation to flip the outcome.

16. The quantum device of claim 9, wherein the depth of the cat state preparation circuit is independent of qubit connectivity, size of the prepared cat sate, and distance between the qubits in the series.

17. One or more tangible computer readable storage media storing processor-executable instructions for executing a computer process to prepare a cat state in a quantum circuit with fault tolerance t and circuit depth less than or equal to 4+4t, the computer process comprising:

performing a sequence of joint parity measurements on individual pairs of neighboring qubits in a series of qubits entangled to form an initial cat state;

repeating the sequence of measurements over at least t-rounds; and disentangling a first set of alternating qubits from the initial cat state to form the prepared cat state with a remaining second set of alternating qubits, the second set of alternating qubits being interlaced with the first set of alternating qubits along a line of one-dimensional connectivity, the prepared cat state being guaranteed with a predefined degree of certainty to include less than or equal to t number of faults.

18. The one or more computer-readable storage media of claim 17, wherein the computer process further comprises:

responsive to determining that any one of the joint parity measurements yields a non-trivial outcome, rejecting the cat state and preparing a new cat state; and proceeding to the next round of the at least t-rounds of measurement responsive to determining that none of the joint parity measurements yields a non-trivial outcome.

19. The one or more computer-readable storage media of claim 17, wherein the computer process further comprises:

performing 2*t-rounds of the sequence of measurements, the 2*t-rounds being sufficient to guarantee with the predefined degree of certainty fault tolerance up to t number of faults without rejecting the cat state under any circumstances.

20. The one or more computer-readable storage media of claim 19, wherein the computer process further comprises:

for each measurement of the 2*t rounds, computing and storing an N-qubit Pauli operator usable to alter a stored quantum state of one or more of the qubits to transform an outcome of the measurement from non-trivial to trivial.

* * * * *